(12) United States Patent
Styles et al.

(10) Patent No.: US 9,218,443 B1
(45) Date of Patent: Dec. 22, 2015

(54) HETEROGENEOUS MULTIPROCESSOR PROGRAM COMPILATION TARGETING PROGRAMMABLE INTEGRATED CIRCUITS

(71) Applicant: Xilinx, Inc., San Jose, CA (US)

(72) Inventors: Henry E. Styles, Menlo Park, CA (US); Jeffrey M. Fifield, Boulder, CO (US); Ralph D. Wittig, Menlo Park, CA (US); Philip B. James-Roxby, Longmont, CO (US); Sonal Santan, San Jose, CA (US); Devadas Varma, Los Altos, CA (US); Fernando J. Martinez Vallina, Sunnyvale, CA (US); Sheng Zhou, San Jose, CA (US); Charles Kwah-Wah Lo, Toronto (CA)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 14/539,975

(22) Filed: Nov. 12, 2014

(51) Int. Cl.
*G06F 17/50* (2006.01)
(52) U.S. Cl.
CPC .................................... *G06F 17/505* (2013.01)
(58) Field of Classification Search
CPC .................. G06F 15/7867; H03K 19/17756
USPC .......................................................... 716/102
See application file for complete search history.

(56) References Cited

U.S. PATENT DOCUMENTS

| | | | |
|---|---|---|---|
| 8,250,503 B2 * | 8/2012 | Vorbach et al. | 716/104 |
| 8,301,872 B2 * | 10/2012 | Vorbach et al. | 713/1 |
| 8,686,549 B2 * | 4/2014 | Vorbach | 257/686 |
| 8,812,820 B2 * | 8/2014 | Vorbach et al. | 712/15 |
| 8,959,469 B2 * | 2/2015 | Chen et al. | 716/117 |
| 2012/0117301 A1 * | 5/2012 | Wingard | 711/6 |
| 2012/0131288 A1 * | 5/2012 | Box et al. | 711/154 |
| 2013/0212365 A1 * | 8/2013 | Chen et al. | 713/1 |

* cited by examiner

*Primary Examiner* — Suchin Parihar
(74) *Attorney, Agent, or Firm* — Kevin T. Cuenot

(57) ABSTRACT

OpenCL program compilation may include generating, using a processor, a register transfer level (RTL) description of a first kernel of a heterogeneous, multiprocessor design and integrating the RTL description of the first kernel with a base platform circuit design. The base platform circuit design provides a static interface within a programmable integrated circuit to a host of the heterogeneous, multiprocessor design. A first configuration bitstream may be generated from the RTL description of the first kernel using the processor. The first configuration bitstream specifies a hardware implementation of the first kernel and supporting data for the configuration bitstream. The first configuration bitstream and the supporting data may be included within a binary container.

20 Claims, 12 Drawing Sheets

```
#define WIDTH 1920
#define LINES 1080
__kernel void sobel(__global int *input, __global int *output)
{
    // 1-D kernel
    unsigned int id = get_local_id(0);

__local int line0[WIDTH];
    __local int line1[WIDTH];
    __local int line2[WIDTH];
    __local int result[WIDTH];

// for each output line in the frame
    for (unsigned line = 1; line < LINES-1; line++)
    {
        // Fetch values
        __global int *in = input + line*WIDTH;
        event_t ev[3];
        ev[0] = async_work_group_copy(line0, in - WIDTH, WIDTH, 0);
        ev[1] = async_work_group_copy(line1, in       , WIDTH, 0);
        ev[2] = async_work_group_copy(line2, in + WIDTH, WIDTH, 0);
        wait_group_events(3, ev);

// Convert to Grayscale
        line0[id] = ((line0[id]       & 0xFF) + ((line0[id] >> 8) & 0xFF) + ((line0[id] >> 16) & 0xFF) + 64) >> 2;
        line1[id] = ((line1[id]       & 0xFF) + ((line1[id] >> 8) & 0xFF) + ((line1[id] >> 16) & 0xFF) + 64) >> 2;
        line2[id] = ((line2[id]       & 0xFF) + ((line2[id] >> 8) & 0xFF) + ((line2[id] >> 16) & 0xFF) + 64) >> 2;

barrier(CLK_LOCAL_MEM_FENCE);

// Calculate Sobel Filter
        if (id != 0 && id != width-1) {
            int gx = - line0[id-1] - 2*line1[id-1] - line2[id-1] + line0[id+1] + 2*line1[id+1] + line2[id+1];
            int gy = - line0[id-1] - line0[id] - line0[id+1] + line2[id-1] + 2*line2[id] + line2[id+1];
            if (gx < 0) gx = -gx;
            if (gy < 0) gy = -gy;
            result[id] = (gx + gy) & 0xFF;
            if (result[id] < 55)
                result[id] = 0xFFFFFFFF;
            else if (result[id] > 155)
                result[id] = 0xFF000000;
            else {
                result[id] = 255 - result[id];
                result[id] = result[id] | (result[id] << 8) | (result[id] << 16) | 0xFF000000;
            }
        } barrier(CLK_LOCAL_MEM_FENCE);

event_t ev0 = async_work_group_copy(output+line*WIDTH+1, result, width-2, 0);
        wait_group_events(1, &ev0);
    }
}
```

FIG. 13-1

HETEROGENEOUS MULTIPROCESSOR PROGRAM COMPILATION TARGETING PROGRAMMABLE INTEGRATED CIRCUITS

FIELD OF THE INVENTION

This disclosure relates to integrated circuits (ICs) and, more particularly, to incorporating programmable ICs into a heterogeneous, multiprocessor design.

BACKGROUND

A heterogeneous, multiprocessor framework provides a standard that is cross-platform and supports parallel programming of modern processors, servers, handheld/embedded devices, and the like. Open Computing Language, referred to as "OpenCL," is an example of a heterogeneous, multiprocessor framework for writing programs that may be executed across heterogeneous computing platforms. A heterogeneous computing platform may include a central processing unit (CPU), a graphics processing unit (GPU), a digital signal processor (DSP), or the like.

A heterogeneous, multiprocessor program, e.g., an OpenCL program, includes a portion that executes on a host system and one or more other portions that execute on devices. Typically, the host system includes the CPU while the devices may be implemented as GPUs, DSPs, etc. The portions that execute on devices, which may be referred to as kernels, may be coded in OpenCL, OpenCL C, or another high level programming language adapted to the heterogeneous, multiprocessor framework or OpenCL. The portion that executes on the host may be programmed in C or C++, for example, and controls the heterogeneous, multiprocessor environment across the various devices.

While the environment described above is heterogeneous in nature, each specific device, whether a DSP or a GPU, has a static architecture. By comparison, a programmable IC such as a field programmable gate array (FPGA) has an extremely flexible hardware architecture that may be used for purposes of hardware acceleration. In order to utilize a programmable IC as a device, however, the circuitry implemented within the programmable IC must be able to interact with the host and operate within the context of the heterogeneous, multiprocessor environment.

SUMMARY

A method includes generating, using a processor, a register transfer level (RTL) description of a first kernel of a heterogeneous, multiprocessor design, integrating the RTL description of the first kernel with a base platform circuit design providing a static region within a programmable integrated circuit (IC) that provides an interface to a host of the heterogeneous, multiprocessor design, and generating, from the RTL description of the first kernel and using the processor, a first configuration bitstream specifying a hardware implementation of the first kernel and supporting data for the configuration bitstream. The method also includes including the first configuration bitstream and the supporting data within a binary container.

A method includes generating, using a processor, an RTL description of a first kernel of a heterogeneous, multiprocessor design, integrating the RTL description of the first kernel with a base platform circuit design providing a static interface within a programmable IC to a host of the heterogeneous, multiprocessor design, and generating, from the RTL description of the first kernel and using the processor, supporting data for the RTL description of the first kernel. The method also includes including the RTL description of the first kernel and the supporting data within a binary container.

A system may include a processor programmed to initiate executable operations. The executable operations include generating an RTL description of a first kernel of a heterogeneous, multiprocessor design, integrating the RTL description of the first kernel with a base platform circuit design providing a static region within a programmable IC that provides an interface to a host of the heterogeneous, multiprocessor design, and generating, from the RTL description of the first kernel, a first configuration bitstream specifying a hardware implementation of the first kernel and supporting data for the configuration bitstream. The method may also include including the first configuration bitstream and the supporting data within a binary container.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIGS. 13-1 and 13-2, taken collectively, illustrate processing of a kernel specified in a heterogeneous, multiprocessor computing language.

DETAILED DESCRIPTION OF THE DRAWINGS

Figure 1:
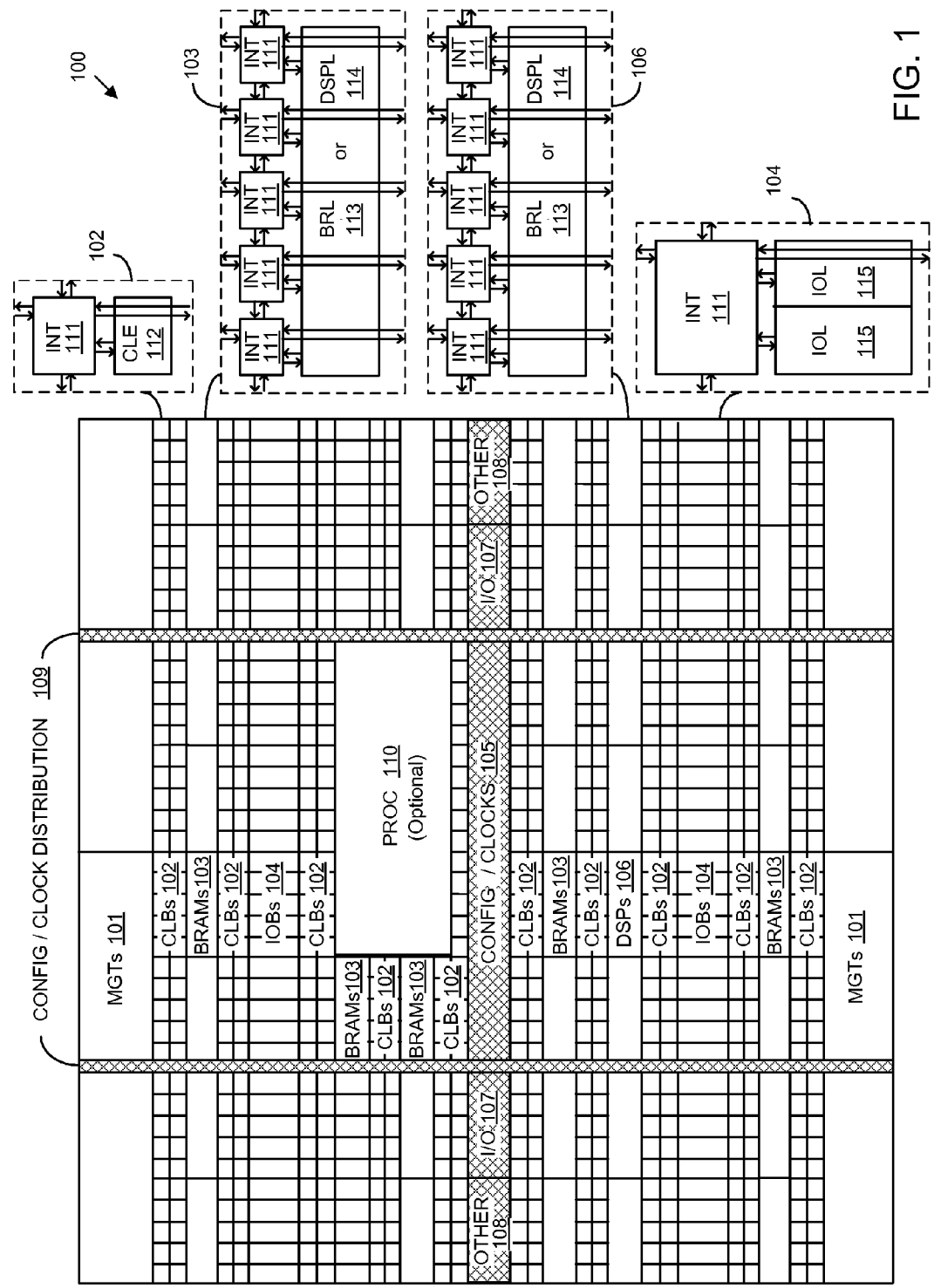
FIG. 1 is a block diagram illustrating an exemplary architecture for an integrated circuit (IC).

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to incorporating programmable ICs into a heterogeneous, multiprocessor system. In accordance with the inventive arrangements described within this disclosure, a programmable IC may be used within a heterogeneous, multiprocessor design to implement one or more kernels. One or more of the kernels of the heterogeneous, multiprocessor may be compiled and transformed into hardware that is implemented using the programmable circuitry of a programmable IC. In this regard, a kernel implemented using a programmable IC is hardware accelerated because the kernel is implemented using circuitry as opposed to being implemented as executable program code that is offloaded for execution to a processor other than the central processing unit (CPU). The kernel portion of the heterogeneous, multiprocessor design, being synthesized into hardware, operates in cooperation with the host of the heterogeneous, multiprocessor design.

In one aspect, the programmable IC may provide a base platform. Kernel(s) may be implemented over and/or in cooperation with the base platform. The base platform provides the infrastructure necessary for the kernels to communicate with a target platform to which the programmable IC is coupled and the host. The base platform, for example, may be implemented or determined by the vendor of the target platform. Thus, the base platform may vary according to the particular model or type of programmable IC that is used and the model or type of target platform used with the programmable IC.

The inventive arrangements described herein may be implemented as a method or process performed by a data processing system. In one example, the method may be directed to implementation of a heterogeneous, multiprocessor design where one or more kernels are implemented in programmable circuitry of a programmable IC. In another example, the method may be directed to operation, e.g., runtime operation, of a heterogeneous, multiprocessor system that includes a kernel implemented using a programmable IC.

In another aspect, the inventive arrangements may be implemented as a data processing system having a CPU. The data processing system may perform a method directed to implementation of a heterogeneous, multiprocessor design, e.g., a compile time method, where one or more kernels are implemented in programmable circuitry of a programmable IC. The data processing system also may include a programmable IC. In that case, the data processing system may perform a method directed to operation, e.g., runtime operation, of a heterogeneous, multiprocessor design that includes a kernel implemented using a programmable IC.

In still another aspect, the inventive arrangements may be implemented as an IC. The IC may include a base platform. The IC may also be configured to include one or more kernels implemented therein that operate cooperatively with the base platform. The IC may implement a runtime method of operating involving the kernel(s) implemented within the IC and/or various host interactions.

In yet another aspect, the inventive arrangements may be implemented as a non-transitory computer-readable storage medium storing program code that, when executed, causes a processor and/or a system to perform and/or initiate the various methods and/or processes described herein.

For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 is a block diagram illustrating an exemplary architecture 100 for an IC. In one aspect, architecture 100 is implemented within a field programmable gate array (FPGA) type of IC. In the case where architecture 100 includes a processor, architecture 100 is also representative of an SOC type of IC. An SOC is an IC that includes a processor that executes program code and one or more other circuit systems. The circuit systems are implemented in the same substrate as the processor. The circuit systems may operate cooperatively with one another and with the processor.

As shown, architecture 100 includes several different types of programmable circuit, e.g., logic, blocks. For example, architecture 100 may include a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized I/O blocks 107 (e.g., configuration ports and clock ports), and other programmable logic 108 such as digital clock managers, analog-to-digital converters, system monitoring logic, and so forth.

In some ICs, each programmable tile includes a programmable interconnect element (INT) 111 having standardized connections to and from a corresponding INT 111 in each adjacent tile. Therefore, INTs 111, taken together, implement the programmable interconnect structure for the illustrated IC. Each INT 111 also includes the connections to and from the programmable logic element within the same tile, as shown by the examples included at the top of FIG. 1.

For example, a CLB 102 may include a configurable logic element (CLE) 112 that may be programmed to implement user logic plus a single INT 111. A BRAM 103 may include a BRAM logic element (BRL) 113 in addition to one or more INTs 111. Typically, the number of INTs 111 included in a tile depends on the height of the tile. As pictured, a BRAM tile has the same height as five CLBs, but other numbers (e.g., four) also may be used. A DSP tile 106 may include a DSP logic element (DSPL) 114 in addition to an appropriate number of INTs 111. An IOB 104 may include, for example, two instances of an I/O logic element (IOL) 115 in addition to one instance of an INT 111. As will be clear to those of skill in the art, the actual I/O pads connected, for example, to IOL 115 typically are not confined to the area of IOL 115.

In the example pictured in FIG. 1, a columnar area near the center of the die, e.g., formed of regions 105, 107, and 108, may be used for configuration, clock, and other control logic. Horizontal areas 109 extending from this column are used to distribute the clocks and configuration signals across the breadth of the programmable IC.

Some ICs utilizing the architecture illustrated in FIG. 1 include additional logic blocks that disrupt the regular columnar structure making up a large part of the IC. The additional logic blocks may be programmable blocks and/or dedicated circuitry. For example, an optional processor block depicted as PROC 110 spans several columns of CLBs and BRAMs.

In one aspect, PROC 110 is implemented as a dedicated circuitry, e.g., as a hardwired processor, that is fabricated as part of the die that implements the programmable circuitry of the IC. PROC 110 may represent any of a variety of different processor types and/or systems ranging in complexity from an individual processor, e.g., a single core capable of executing program code, to an entire processor system having one or more cores, modules, co-processors, interfaces, or the like.

In another aspect, PROC 110 is omitted from architecture 100 and replaced with one or more of the other varieties of the programmable blocks described. Further, such blocks may be utilized to form a "soft processor" in that the various blocks of programmable circuitry may be used to form a processor that can execute program code as is the case with PROC 110.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, portions shown in FIG. 1 that are external to PROC 110 such as CLBs 102 and BRAMs 103 are considered programmable circuitry of the IC.

In general, the functionality of programmable circuitry is not established until configuration data is loaded into the IC. A set of configuration bits may be used to program programmable circuitry of an IC such as an FPGA. The configuration bit(s) typically are referred to as a "configuration bitstream." In general, programmable circuitry is not operational or functional without first loading a configuration bitstream into the IC. The configuration bitstream effectively implements or instantiates a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 110.

In some instances, hardwired circuitry may have one or more operational modes that may be set or selected according to register settings or values stored in one or more memory elements within the IC. The operational modes may be set, for example, through the loading of a configuration bitstream into the IC. Despite this ability, hardwired circuitry is not considered programmable circuitry as the hardwired circuitry is operable and has a particular function when manufactured as part of the IC.

In the case of an SOC, the configuration bitstream may specify the circuitry that is to be implemented within the programmable circuitry and the program code that is to be executed by PROC 110 or a soft processor. In some cases, architecture 100 includes a dedicated configuration processor that loads the configuration bitstream to the appropriate configuration memory and/or processor memory. The configuration processor, unlike PROC 110 when included, does not execute user program code. In other cases, architecture 100 may utilize PROC 110 to receive the configuration bitstream, load the configuration bitstream into appropriate configuration memory, and/or extract program code for execution.

FIG. 1 is intended to illustrate an exemplary architecture that may be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. In an actual IC, for example, more than one adjacent column of CLBs is typically included wherever the CLBs appear, to facilitate the efficient implementation of a user circuit design. The number of adjacent CLB columns, however, may vary with the overall size of the IC. Further, the size and/or positioning of blocks such as PROC 110 within the IC are for purposes of illustration only and are not intended as limitations.

Figure 2:
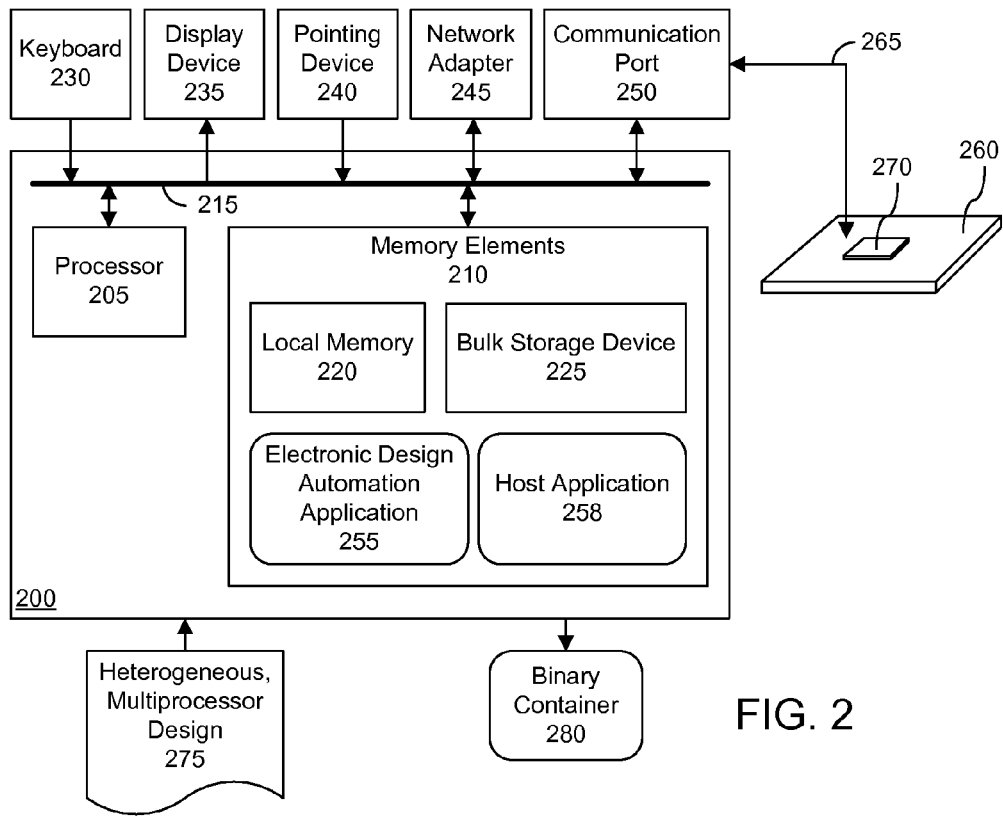
FIG. 2 is a block diagram illustrating an exemplary data processing system (system).

FIG. 2 is a block diagram illustrating an exemplary data processing system (system) 200. In one aspect, system 200 may represent a compile-time system that may be programmed to implement kernels of a heterogeneous, multiprocessor design, e.g., a program, as circuitry within a programmable IC. As defined herein, a "heterogeneous, multiprocessor design" is a program that includes a portion that executes on a host system and at least one additional portion called a kernel that executes on a different device or processor. An example of a heterogeneous, multiprocessor design is an OpenCL program or design. In one example, the portion that executes on the host may be specified in a different programming language than the portion that executes on the different device or processor. The programmable IC may have an architecture as described with reference to FIG. 1.

In another aspect, system 200 may represent a runtime, heterogeneous, multiprocessor system where the processor functions as the host and the programmable IC implements one or more kernels. A "heterogeneous, multiprocessor system," as defined herein, is a computing system that includes two or more processors. The two or more processors may be different types of processors. For example, the heterogeneous, multiprocessor system may include a central processing unit (CPU), a graphics processing unit (GPU), a digital signal processor (DSP), a programmable IC such as an FPGA, or the like. The heterogeneous, multiprocessor system may be an OpenCL system.

As pictured, system 200 includes at least one processor, e.g., a central processing unit (CPU), 205 coupled to memory elements 210 through a system bus 215 or other suitable circuitry. System 200 stores program code within memory elements 210. Processor 205 executes the program code accessed from memory elements 210 via system bus 215. In one aspect, system 200 is implemented as a computer or other data processing system that is suitable for storing and/or executing program code. It should be appreciated, however, that system 200 may be implemented in the form of any system including a processor and memory that is capable of performing the functions described within this disclosure. Further, system 200 may be implemented as one or more networked data processing systems, e.g., servers.

Memory elements 210 include one or more physical memory devices such as, for example, a local memory 220 and one or more bulk storage devices 225. Local memory 220 refers to random access memory (RAM) or other non-persistent memory device(s) generally used during actual execution of the program code. Bulk storage device 225 may be implemented as a hard disk drive (HDD), solid state drive (SSD), or other persistent data storage device. System 200 may also include one or more cache memories (not shown) that provide temporary storage of at least some program code in order to reduce the number of times program code must be retrieved from bulk storage device 225 during execution.

Input/output (I/O) devices such as a keyboard 230, a display device 235, and a pointing device 240 optionally may be coupled to system 200. The I/O devices may be coupled to system 200 either directly or through intervening I/O controllers. A network adapter 245 may also be coupled to system 200 to enable system 200 become coupled to other systems, computer systems, remote printers, remote storage devices, and/or a target platform 260 through intervening private or public networks. Modems, cable modems, Ethernet cards, and wireless transceivers are examples of different types of network adapter 245 that may be used with system 200. A communication port 250 such as a Universal Serial Bus port, a FireWire port, a Peripheral Component Interconnect (PCI) and/or PCI Express (PCIe) port, or the like also may be coupled to system 200 to allow system 200 to become coupled to another system such as any of the aforementioned systems including target platform 260.

In one aspect, memory elements 210 store an electronic design automation (EDA) application 255. EDA application 255 may be stored, for example, in an implementation where system 200 represents a compile-time system. EDA application 255 may include one or more different components or modules. EDA application 255, being implemented in the form of executable program code, is executed by system 200. As such, EDA application 255 is considered an integrated part of system 200. EDA application 255 and any data items used, generated, and/or operated upon by system 200 while executing EDA application 255 are functional data structures that impart functionality when employed as part of system 200. As a compile-time system, host application 258 may be excluded from system 200.

In the case of a compile-time system, a user works through system 200, executing EDA application 255. System 200 may receive a heterogeneous, multiprocessor design 275 as an input and synthesize one or more kernels of heterogeneous, multiprocessor design 275 into circuitry that may be implemented within IC 270. System 200 may generate and output a binary container 280. In one aspect, binary container 280 may include a description of the contents therein and one or more configuration bitstreams, whether partial or full. In another aspect, binary container 280 may include a description of the contents therein, one or more executable simulation files, and/or one or more register transfer level (RTL) files that may be simulated within an RTL or hardware description language simulator. In that case, binary container 280 may include, in addition to the executable simulation file(s) and/or the RTL file(s), one or more configuration bitstreams, whether partial or full. Binary container 280 may be stored in memory elements 210 and/or provided to another system by way of network adapter 245 and/or communication port 250.

In another aspect, memory elements 210 store a host application 258. Host application 258 may be stored, for example, in an implementation where system 200 represents a heterogeneous, multiprocessor runtime system. Host application 258 may include one or more different components or modules. Host application 258, being implemented in the form of executable program code, is executed by system 200. As such, host application 258 is considered an integrated part of system 200. Host application 258 and any data items used, generated, and/or operated upon by system 200 while executing host application 258 are functional data structures that impart functionality when employed as part of system 200. As a runtime system, EDA application 255 may be excluded from system 200.

System 200 may be coupled to target platform 260 through a communication link 265. In the case of a runtime system implementation, target platform 260 is coupled to, or considered part of, system 200. Thus, it should be appreciated that in the case of a compile-time system target platform 260 may be excluded. Continuing with target platform 260, communication link 265 may be implemented as any of a variety of different wired and/or wireless connections that are operable to couple to communication port 250 and/or network adapter 245.

Target platform 260 may be implemented as a circuit board such as a printed circuit board having circuitry implemented thereon. Target platform may be implemented as a card that may be plugged into a mechanical connector for communication port 250, e.g., within system 200, or external to system 200. Target platform 260 may include a connector that couples to communication link 265. The connector may be coupled, using circuitry of target platform 260, to an IC 270.

IC 270 may be coupled to target platform 260 using a socket, a receptacle, another mounting technique such as soldering IC 270 directly to target platform 260, or the like. IC 270 couples to communication link 265 through target platform 260. In one aspect, IC 270 is a programmable IC. IC 270, for example, may be implemented using the architecture described with reference to FIG. 1. In another aspect, IC 270 may be implemented as an SOC. IC 270 may implement one or more kernels of a heterogeneous, multiprocessor design as circuitry. The heterogeneous, multiprocessor design may be an OpenCL design.

In the case of a runtime system, processor 205 may operate as the host. One or more kernels of a heterogeneous, multiprocessor design may be implemented within IC 270. During operation, new and/or different kernels may be implemented within IC 270 as needed since IC 270 may be configured, or re-configured as the case may be, dynamically while in operation without causing interruption to other portions of IC 270 that are not being configured or re-configured as the case may be.

Figure 3:
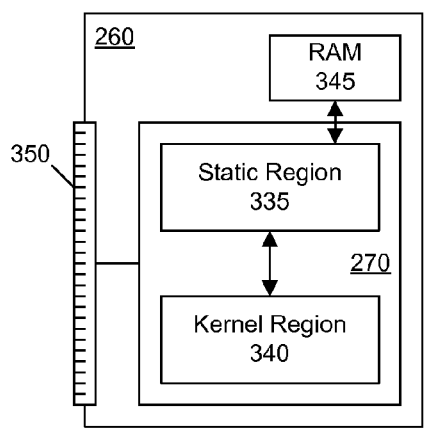
FIG. 3 is a block diagram illustrating an exemplary architecture for the target platform of FIG. 2.

FIG. 3 is a block diagram illustrating an exemplary architecture for target platform 260 of FIG. 2. As shown, IC 270 and RAM 345 are coupled to target platform 260. Target platform 260 also includes a connector 350 that is coupled to IC 270. While illustrated as a card edge type of connector, it should be appreciated that connector 350 may be implemented as any of a variety of different connector types. Further, target platform 260 may include one or more other components (not shown). The additional components, for example, may be coupled between connector 350 and IC 270.

IC 270 includes a static region 335 and a kernel region 340. In one aspect, static region 335 includes infrastructure IP needed to support the heterogeneous, multiprocessor programming model. In one example, the heterogeneous, multiprocessor programming model is an OpenCL model. Static region 335, for example, communicatively links kernel region 340 with other components located on target platform 260 such as RAM 345 and/or other systems such as the host, e.g., processor 205, during runtime. Static region 335, for example, may implement a software interface used to communicate with the host. In one aspect, static region 335 may be a circuit implementation that is provided by the vendor and/or manufacturer of target platform 260.

Kernel region 340 represents the portion of IC 330 where kernels are implemented. In one aspect, kernel region 340 may have a memory mapped interface with static region 335. Kernel region 340, unlike static region 335, may be dynamically generated and integrated with static region 335. For example, different kernels and different combinations of kernels may be implemented at different times within kernel region 340 during runtime.

Figure 4:
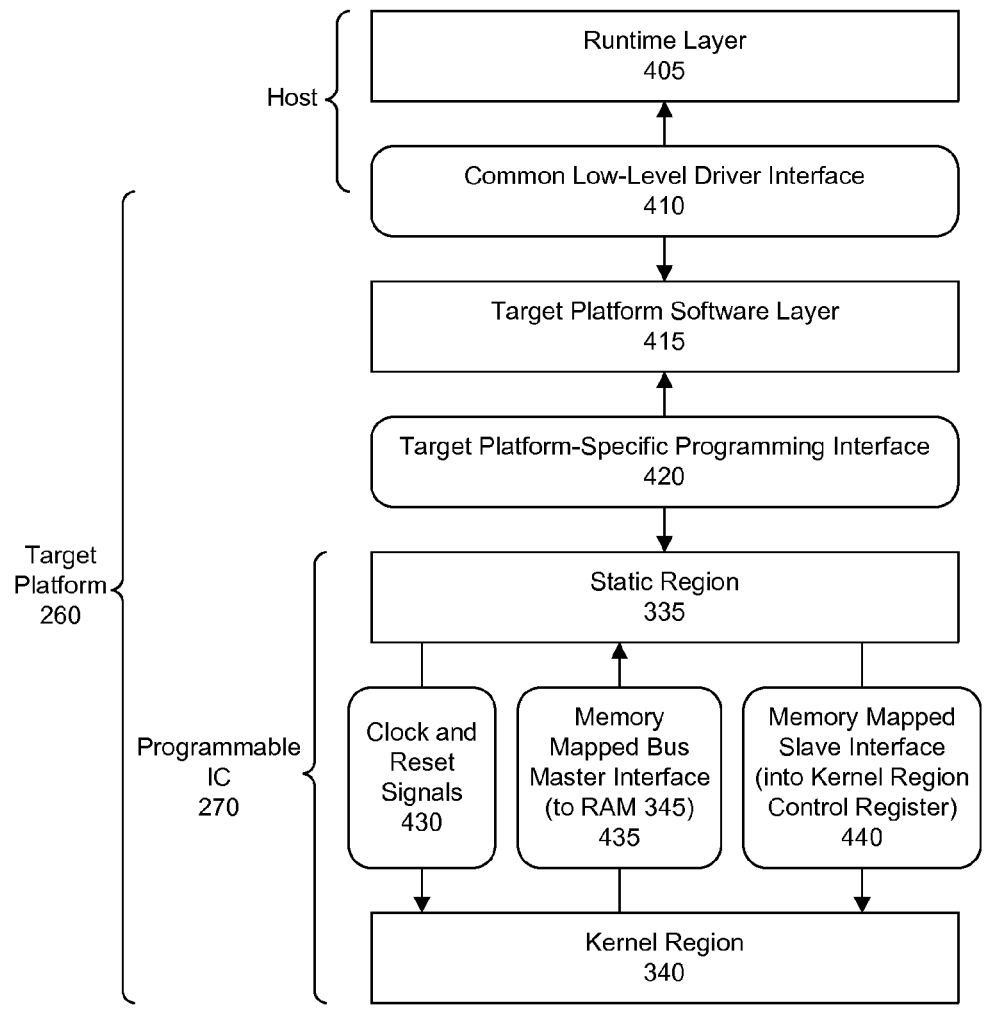
FIG. 4 is a block diagram illustrating exemplary layers of a heterogeneous, multiprocessor runtime system including the target platform of FIGS. 2 and 3.

FIG. 4 is a block diagram illustrating exemplary layers of a heterogeneous, multiprocessor runtime system including target platform 260. In one example, the heterogeneous, multiprocessor runtime system is an OpenCL system. As pictured, the host executes a runtime layer 405 that is implemented within a host application. As discussed, the host may be implemented as processor 205 of system 200 described with reference to FIG. 2. A target platform software layer 415 is implemented within the target platform circuitry. Runtime layer 405 communicates with target platform software layer 415 through a common low-level driver interface 410. For example, runtime layer 405 uses standard, documented application programming interfaces (APIs) defined in common low level driver 410 to communicate with target platform software layer 415. Target platform software layer 415, for example, may be implemented as a kernel driver.

Target platform software layer 415, executing in circuitry of target platform 260, communicates with static region 335 through a target platform-specific programming interface 420, e.g., a hardware programming interface. Static region 335 provides kernel region 340 with clock and reset signals 430. Static region 335 also provides information to kernel region 340 through a memory mapped slave interface 440 that is coupled to a control register (not shown). Kernel region 340 provides information to static region 335 through a memory mapped bus master interface 435 that is coupled to RAM 345.

Figure 5:
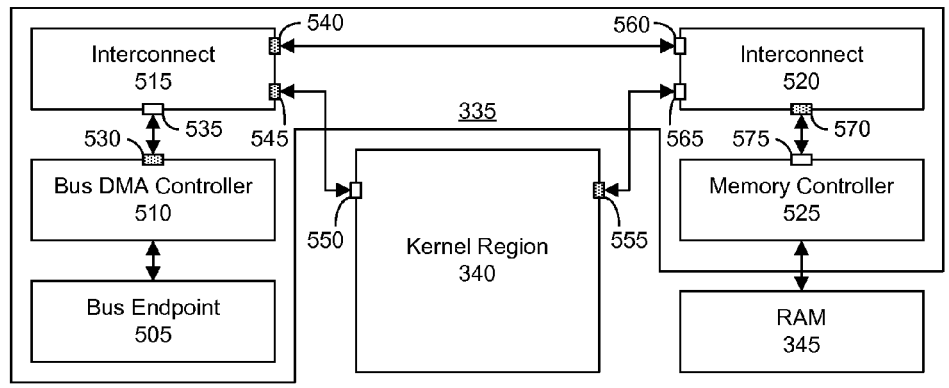
FIG. 5 is a block diagram illustrating exemplary circuitry implemented within the IC of FIG. 3.

FIG. 5 is a block diagram illustrating exemplary circuitry implemented within IC 270 of FIG. 3. More particularly, FIG. 5 illustrates an exemplary architecture that may be used to implement static region 335. Each of blocks 505, 510, 515, 520, and 525 represents a circuit block. Each of blocks 505-525, as part of static region 335, and kernel region 340, may be implemented within programmable circuitry of IC 270.

As pictured, static region 335 may include a bus endpoint 505 coupled to a bus direct memory access (DMA) controller 510. Bus DMA controller 510 is coupled to interconnect 515. Interconnect 515 couples to interconnect 520 and to kernel region 340. Interconnect 520 couples to kernel region 340 and to memory controller 525. Memory controller 525 couples to RAM 345, which is implemented off-chip IC 270.

Bus endpoint 505 is configured to communicate over a bus with the host of the heterogeneous, multiprocessor design. Bus DMA controller 510 may be included to support DMA functionality between host RAM, e.g., local memory 220, and RAM 345 on target platform 260. In one aspect, bus DMA controller 510 includes a master interface 530. Interconnect 515 may include a slave interface 535 and master interfaces 540 and 545. As shown, slave interface 535 is coupled to master interface 530. Kernel region 340 includes a slave interface 550 and a master interface 555. Master interface 545 of interconnect 515 is coupled to slave interface 550 of kernel region 340.

Interconnect 520 includes slave interfaces 560 and 565 and a master interface 570. Memory controller 525 includes a slave interface 575. As pictured, master interface 540 of interconnect 515 is coupled to slave interface 560 of interconnect 520. Master interface 555 of kernel region 340 is coupled to slave interface 565 of interconnect 520.

Interconnects 515 and 520 are circuit blocks configured to couple two or more other circuit blocks together. In one aspect, interconnects 515 and 520 may be implemented as circuit blocks that couple one or more memory-mapped master devices with one or more memory mapped slave devices. An example of an interconnect circuit block implementation is one that conforms to the AMBA® AXI version 4 specifications from ARM® Ltd. of Cambridge, UK. It should be appreciated, however, that other interconnect types and/or technologies may be used to implement interconnects 515 and 520. The disclosure is not intended to be limited by the exemplary interconnect circuit blocks provided.

Within the architecture illustrated in FIG. 5, bus DMA controller 510 and kernel region 340 function as masters for memory controller 525. Interconnect 515 allows the host, for example, to read and write RAM 345 over the bus. Interconnect 520 supports the creation of two bus masters, i.e., bus DMA controller 510 and kernel region 340, for memory controller 525.

Kernel Region 340 may initially be implemented as a container for compiled heterogeneous, multiprocessor design kernels. In one aspect, kernel region 340 may be implemented as a hierarchical IP having a placeholder for compiled kernels. One or more kernels may be included within kernel region 340. In one example, up to 16 kernels may be included in kernel region 340. Commands from the host may be received through slave interface 550. Kernel region 340 may provide commands to memory controller 525 through master interface 555. Clock and reset signals are provided to kernel region 340 and to any kernels implemented therein through the connection between master interface 545 and slave interface 550.

Figure 6:
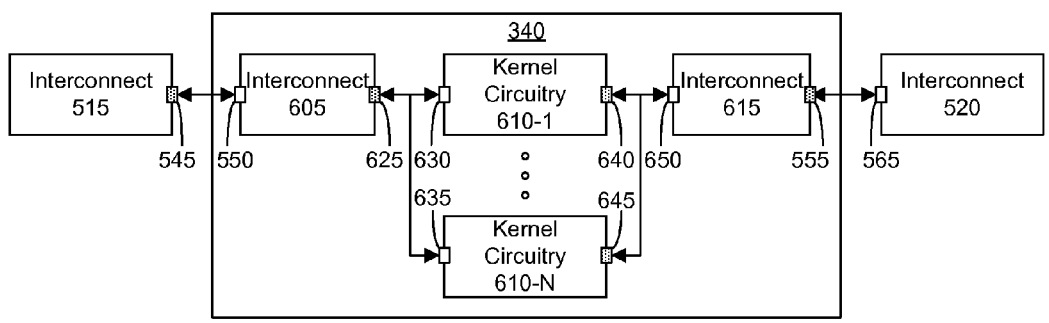
FIG. 6 is a block diagram illustrating an exemplary implementation of a kernel region.

FIG. 6 is a block diagram illustrating an exemplary implementation of kernel region 340. As pictured, kernel region 340 includes additional interconnects 605 and 615. Interconnect 605 includes slave interface 550 coupled to master interface 545 of interconnect 515. Interconnect 605 further includes a master interface 625 coupled to a slave interface 630 of a kernel circuitry 610-1. Master interface 625 also may couple to one or more other kernel circuitries 610-N, where N is an integer value.

Kernel circuitries 610, collectively illustrated as kernel circuitry 610-1 through 610-N, may represent a plurality of instances of same kernel circuitry and, as such, a plurality of instances of a same kernel. In another example, kernel circuitries 610 may represent two or more different kernel circuitries. In still another example, kernel circuitries 610 may represent one or more instances of a first kernel circuitry and one or more additional, different kernel circuitries. Interconnect 615 has a slave interface 650 that couples to a master interface 640 and 645 of each kernel circuitry 610. Interconnect 615 includes master interface 555 that couples to slave interface 565 of interconnect 520.

In one aspect, interconnects 605 and 615 may support up to 16 different instances of kernel circuitry, 16 different kernel circuitries, or a combination thereof not to exceed 16. As discussed, the particular number of kernels and/or kernel instances that may be implemented within kernel region 340 is provided for purposes of illustration and not limitation.

Within a heterogeneous, multiprocessor framework such as OpenCL, parallel kernel invocation may be described as a 1, 2, or 3-D index space referred to as an NDRange. The NDRange is subdivided into work groups. Work groups include multiple work items. For example, each point in the NDRange is referred to as a work item.

The kernel of a heterogeneous, multiprocessor design is compiled into one or more compute units. The system designer, e.g., a user, determines the number of compute units that are to be implemented in parallel for a given kernel. In one aspect, the number of compute units for the kernel indicates the number of instances of the kernel circuitry implemented within kernel region 340 and operating in parallel. Each compute unit is able to process one work group as determined and provided by the host.

In the example of FIG. 6, each kernel circuitry block 610-1 through 610-N represents the circuitry of a work unit. Kernel circuitry blocks 610-1 through 610-N may represent work units of a same kernel, e.g., multiple instances operating in parallel, or work units of two or more kernels operating in parallel where one or more of the kernels are implemented within kernel region 340 with multiple instances.

Figure 7:
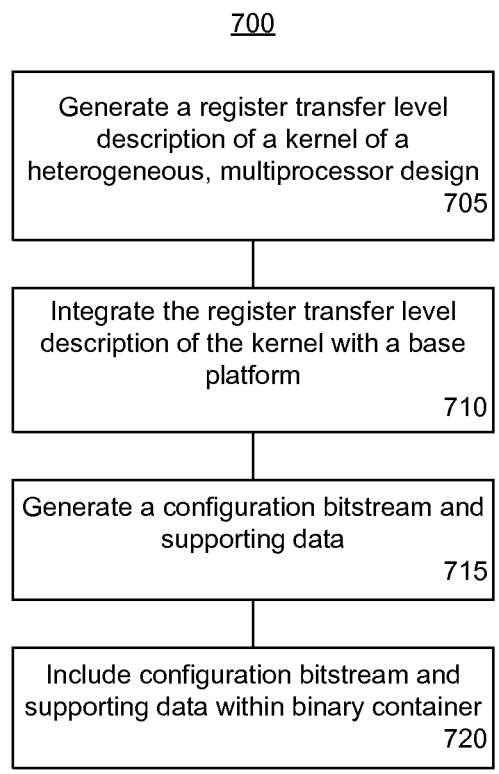
FIG. 7 is a flow chart illustrating an exemplary method of implementing a kernel of a heterogeneous, multiprocessor design.

FIG. 7 is a flow chart illustrating an exemplary method 700 of implementing a kernel of a heterogeneous, multiprocessor design. In one example, the heterogeneous, multiprocessor design may be an OpenCL design. Method 700 may be performed by a compile-time system such as the system described with reference to FIG. 2. Method 700 may begin in a state where a heterogeneous, multiprocessor design includes a kernel that is specified in C, C++, OpenCL, OpenCL C, an OpenCL compatible high level programming language, or other high level programming language. In one aspect, any of a variety of high level programming languages may be used to specify the kernel. In a further aspect, the high level programming language used to specify the kernel may be one that supports an explicit specification, or notation, of parallelism or parallel operations. The system has access to the kernel.

In block 705, the system generates an RTL description of the kernel. The RTL description may be specified using a hardware description language (HDL). As defined herein, the term "hardware description language" or "HDL" is a computer-language that facilitates the documentation, design, and manufacturing of a digital system, such as an integrated circuit. An HDL combines program verification techniques with expert system design methodologies. Using an HDL, for example, a user can design and specify an electronic circuit, describe the operation of the circuit, and create tests to verify operation of the circuit. An HDL includes standard, text-based expressions of the spatial and temporal structure and behavior of the electronic system being modeled. HDL syntax and semantics include explicit notations for expressing concurrency. In contrast to most high level programming languages, an HDL also includes an explicit notion of time, which is a primary attribute of a digital system.

In block 710, the system integrates the RTL description of the kernel with a base platform. In one aspect, the base platform may be similar to, or the same as, the circuit design implemented within static region 335 and described with reference to FIGS. 4 and/or 5.

In block 715, the system generates a configuration bitstream and supporting data. The configuration bitstream specifies a hardware implementation of the kernel, e.g., the compute units as described with reference to FIG. 6. In one aspect, the configuration bitstream may be a partial bitstream that specifies only the kernel or one or more kernels, for example. In another aspect, the configuration bitstream may be a full bitstream that specifies the kernel, or kernels as the case may be, and the base platform.

The supporting data describes the configuration bitstream and/or the contents of the configuration bitstream. In one aspect, the supporting data may specify a list of IP blocks and/or cores included in the kernel implementation. In another aspect, the supporting data may specify a two-dimensional coordinate location within the programmable IC at which the hardware implementation of the kernel will be implemented when specified as a partial configuration bitstream.

In block 720, the system includes the configuration bitstream and the supporting data within a binary container. In one aspect, the binary container may include multiple individual files. For example, the binary container may include one or more configuration bitstreams and one or more supporting data files.

In another aspect, RTL descriptions of the kernel(s) may be included within the binary container. The RTL descriptions may then be used with an RTL simulator to test the kernel implementations as part of an overall heterogeneous, multiprocessor design simulation. For example, the host may provide the binary container including the RTL description(s) to the RTL simulator during a runtime simulation of the heterogeneous, multiprocessor design. The RTL simulator may access the RTL descriptions from the binary container. In still another aspect, an executable version of the kernel(s) may be included in the binary container that may be executed using a processor for testing and/or simulation purposes. For example, the host may provide the binary container including the executable version of the kernel to a simulator during a runtime simulation of the heterogeneous, multiprocessor design. It should be appreciated that the executable version of the kernel may be an executable model of a hardware implementation of the kernel. The simulator may access the executable version of the kernel from the binary container. Thus, the binary container supports multiple different kernel implementations whether as configuration bitstreams for runtime with a programmable IC, executable versions for simulation on a data processing system, and/or RTL versions for simulation using an RTL simulator.

The binary container may include only configuration bitstream(s); only executable version(s) of the kernel(s); only RTL version(s) of the kernel(s); a configuration bitstream and an RTL version of the kernel; a configuration bitstream and an executable version of the kernel; an executable and RTL versions of the kernel(s); or a configuration bitstream, an executable version of the kernel(s), and RTL versions of the kernel(s). The supporting data also may be included for any of the aforementioned combinations of kernel versions implemented within the binary container. Existing containers used by CPU and/or GPU vendors in heterogeneous, multiprocessor designs and, in particular, OpenCL designs, work with "in memory" and address mapped objects. Such containers do not support simulation versions of the kernel or multiple different kernel types within the same container.

While the binary container used may support multiple different types of kernel implementations, in one aspect, a first container may include a first type of kernel implementation, e.g., a configuration bitstream, an RTL description, or an executable, while a second binary container may include a different type of kernel implementation. In still another aspect, a first container may include a partial configuration bitstream specifying a first kernel while a second container may include a partial configuration bitstream specifying a second and different kernel.

Standard APIs for a heterogeneous, multiprocessor computing language such as OpenCL for communication between host and kernels support only binary object files. The binary container generated by the system complies with this binary requirement that all pre-compiled kernels are to be accessible through a self-contained object. The binary container generated in block 720 may be used by the host to implement kernel circuitry, e.g., compute units, within the programmable IC during runtime.

Figure 8:
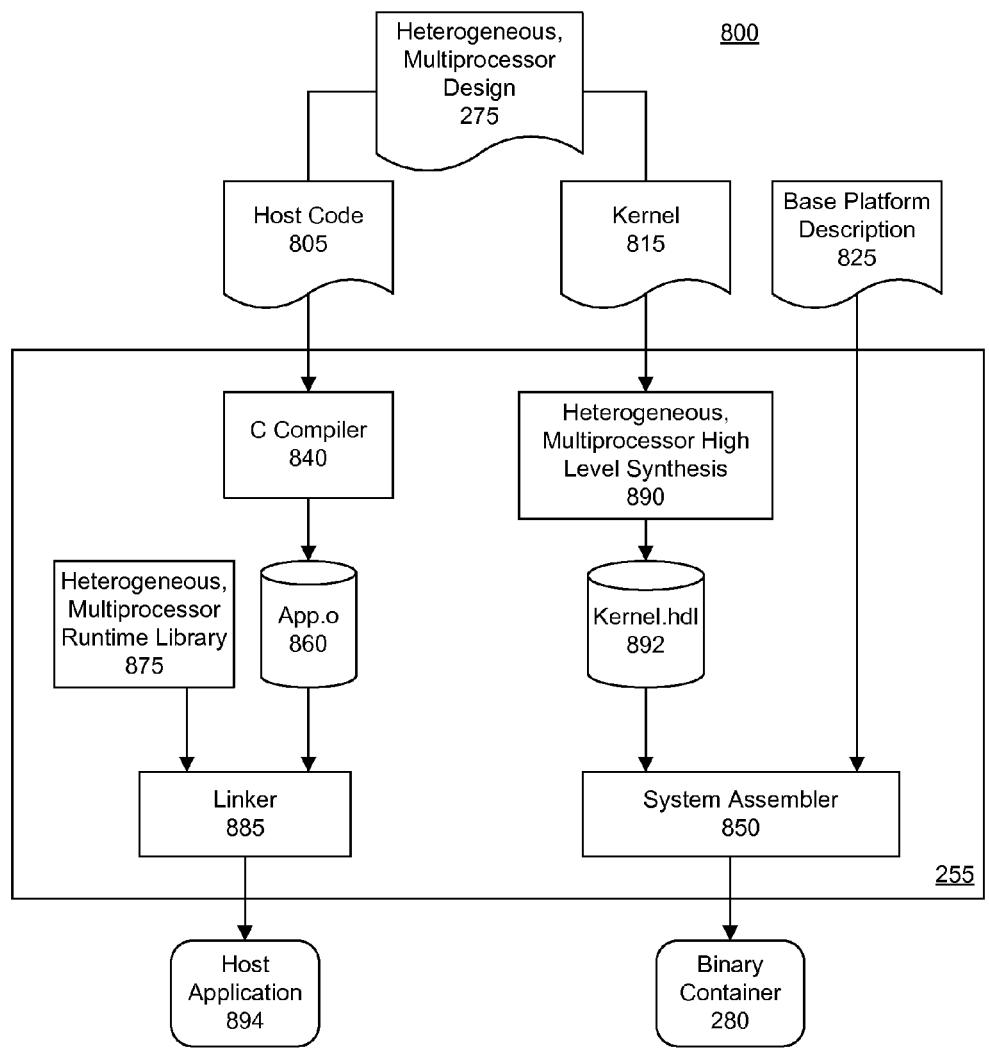
FIG. 8 is a block flow diagram illustrating an exemplary process for implementing a kernel of a heterogeneous, multiprocessor design within a programmable IC.

FIG. 8 is a block flow diagram illustrating an exemplary process 800 for implementing a kernel of a heterogeneous, multiprocessor design within a programmable IC. In one example, the heterogeneous, multiprocessor design may be an OpenCL design. Process 800 may be performed by a system such as the system described with reference to FIG. 2 executing EDA application 255. In one aspect, EDA application 255 may be implemented as an OpenCL compiler tool. Process 800 illustrates an exemplary compile-time system implementation.

As shown, heterogeneous, multiprocessor design 275, e.g., also referred to as a heterogeneous, multiprocessor application, an OpenCL design, or an OpenCL application, may include host code 805 and kernel 815. It should be appreciated that while one kernel is pictured, heterogeneous, multiprocessor design 275 may include more than one kernel that may be implemented through process 800. Host code 805 is the portion of heterogeneous, multiprocessor design 275 that executes in the host. Host code 805 may be specified in a high level programming language such as C, C++, or the like.

As defined herein, the term "high level programming language" means a programming language, or set of instructions, used to program a data processing system where the instructions have a strong abstraction from the details of the data processing system, e.g., machine language. For example, a high level programming language may automate or hide aspects of operation of the data processing system such as memory management. The amount of abstraction typically defines how "high level" the programming language is. When a high level programming language, the user need not contend with registers, memory addresses, etc. of the data processing system upon which the high level programming language will execute. In this regard, a high level programming language includes little or no instructions that translate directly, on a one-to-one basis, into a native opcode of a data processing system. Examples of high level programming languages include, but are not limited to, C, C++, SystemC, or the like.

Host code 805 is provided to C compiler 840 or other high level language compiler. C compiler 840 generates an object code version of host code 805 depicted as App.o 860. Linker 885 receives a heterogeneous, multiprocessor runtime library 875, app.o 860, and generates a host application 894. Heterogeneous, multiprocessor runtime library 875 may include a common low level driver used to communicate with the target platform. Host application 894 is executed by the CPU of a runtime, heterogeneous, multiprocessor system.

Heterogeneous, multiprocessor high level synthesis block 890 receives kernel 815 and generates kernel.hdl 892. Kernel.hdl 892 is an RTL version of kernel 815. System assembler 850 receives kernel.hdl 892 and base platform description 825. In one aspect, base platform description 825 may be a metadata file describing aspects of the actual base platform. As noted, the base platform is the circuitry implemented within static region 335 of programmable IC 270.

From base platform description 825, system assembler 850, for example, determines the target platform and the particular type of programmable IC to be used for kernel implementation. For example, system assembler 850 may identify a directory that specifies implementation details about the base platform and the low level driver needed by the host to communicate with the target platform and base platform. The identified directory may include one or more packaged IPs of the base platform. System assembler 850 may retrieve the packaged IPs of the base platform, including interconnect IPs coupling the base platform with the kernel.

The interconnect IPs, for example, may specify the various interconnect circuit blocks needed to integrate, or incorporate, kernel.hdl 892 with the packaged IPs of the base platform. System assembler 850 generates binary container 280. System assembler 850 may generate a configuration bitstream specifying a hardware implementation of kernel 815 that integrates with the base platform that is included in binary container 280.

Each configuration bitstream included in binary container 280, for example, may implement one or more compute units determined from kernel 815, or kernel.hdl 892, as the case may be. As discussed, the system designer determines the number of compute units that are to be implemented in parallel for a given kernel.

System assembler 850, depending upon user preference, may include kernel.hdl 892, e.g., an RTL version of kernel 815 for RTL simulation, and/or an executable, e.g., an object code version, of kernel 815 for simulation, within binary container 280 as previously described. System assembler 850 also includes the supporting data (not shown) within binary container 280.

In one aspect, system assembler 850 integrates kernel 815 with the base platform. System assembler 850, having information specified in base platform description 825 and kernel- .hdl 892, for example, may integrate kernel 815 with the base platform by performing functions such as technology mapping, placement, routing, etc., resulting in a configuration bitstream. The configuration bitstream may be a full configuration bitstream specifying both the base platform and the kernel or a partial configuration bitstream specifying only the kernel. In any case, system assembler 850 uses the specified interconnect IPs to couple the base platform with the kernel.

In still another aspect, system assembler 850 may generate binary container 280 to include files other than a configuration bitstream. For example, as noted, kernel 815 may be provided to a heterogeneous, multiprocessor compiler that generates a processor-executable, e.g., an object code, version of kernel 815. The executable version of kernel 815, e.g., an executable model of a hardware implementation of kernel 815, may be provided to system assembler 850. System assembler 850 may include the executable version of kernel 815 within binary container 280 in place of the configuration bitstream. In another example, system assembler 850 may include kernel.hdl 892 within binary container 280 in place of the configuration bitstream.

Figure 9:
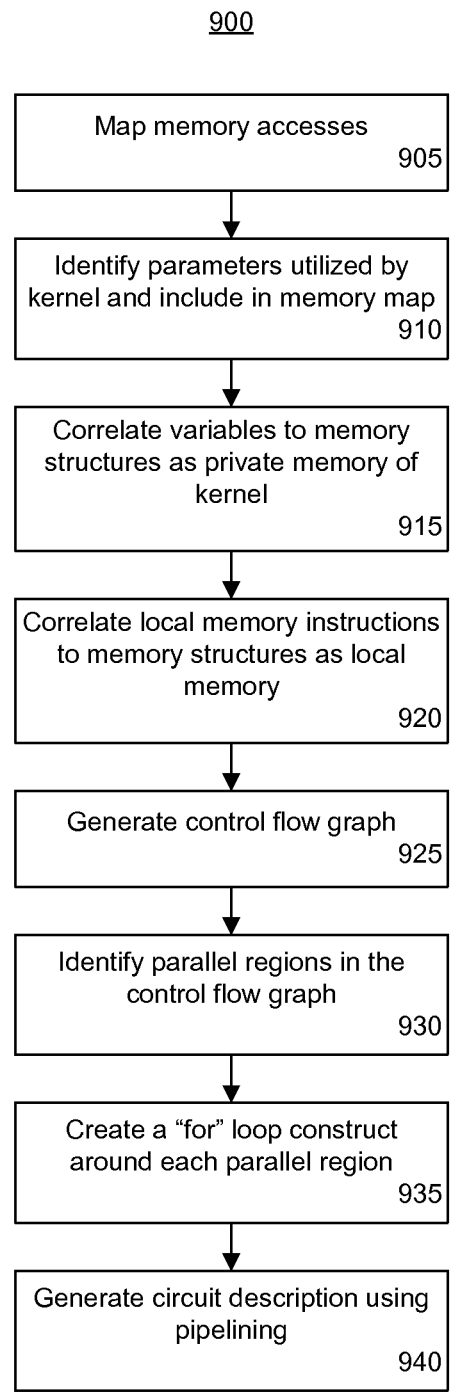
FIG. 9 is a flow chart illustrating an exemplary method of processing a kernel specified in a heterogeneous, multiprocessor computing language for implementation within a programmable IC.

FIG. 9 is a flow chart illustrating an exemplary method 900 of processing a kernel specified in heterogeneous, multiprocessor computing language for implementation within IC 270. In one example, the heterogeneous, multiprocessor computing language may be OpenCL. Method 900 may be performed by a compile-time system such as the system described with reference to FIG. 2. In one aspect, method 900 illustrates various operations performed during the generation of an RTL description of a kernel initially specified in OpenCL C, C, C++, another high level programming language, or a derivative and/or variant of one of the languages noted within this disclosure.

In block 905, the system identifies and maps memory accesses of the kernel. The heterogeneous, multiprocessor global memory may be mapped to a master memory bus. For example, the OpenCL global memory may be mapped to an AXI master memory bus. Kernel parameters may be mapped to a slave control bus. For example, the kernel parameters may be mapped to an AXI slave control bus.

In block 910, the system identifies parameters utilized by the kernel and includes the parameters within a memory map for the hardware implementation of the kernel in the IC. In block 915, the system correlates variables to memory structures of the IC as private memory for the kernel. In block 920, the system correlates local memory instructions to memory structures of the IC as local memory for the kernel.

In block 925, the system generates a control flow graph for the kernel. In one aspect, the system converts the kernel into LLVM Intermediate Representation (IR) format. From the LLVM IR format, the system generates the control flow graph by identifying data flows therein. In block 930, the system identifies parallel regions of the kernel using the control flow graph. The parallel regions may be isolated in the control flow graph. For example, for each parallel region in the control flow graph, the region will have one control edge coming into the region and one control edge leaving the region.

In block 935, the system optionally constructs a "for" loop around each parallel region. Identifying the parallel regions and representing each as a "for" loop allows the kernel, which is a data parallel implementation, to be represented as a sequential high level programming language such as C, C++, or the like. In block 940, the system generates a circuit description using pipelining. For example, the system, by representing the parallel region as a "for" loop, may synthesis the region as a high level programming language such as C, C++, or the like, would be synthesized.

Figure 10:
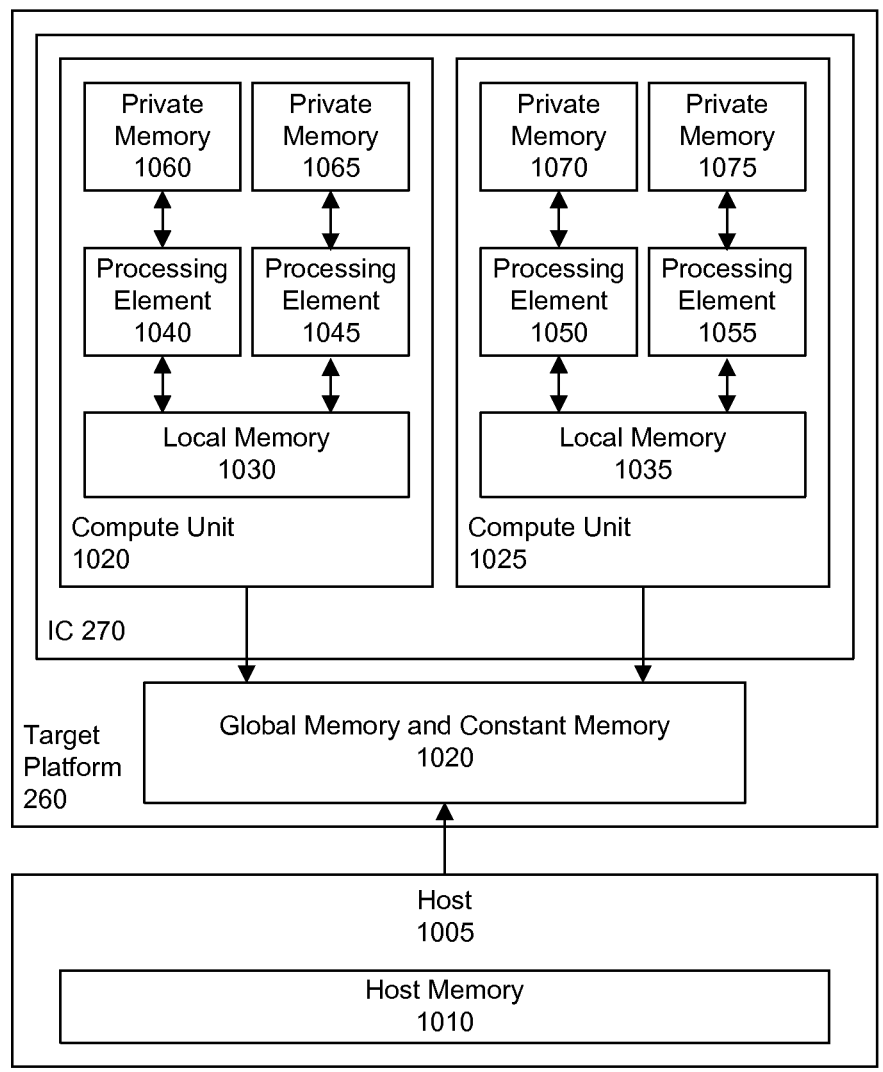
FIG. 10 is a block diagram illustrating exemplary processing of a kernel specified in a heterogeneous, multiprocessor computing language.

FIG. 10 is a block diagram illustrating an exemplary memory architecture 1000 of a heterogeneous, multiprocessor system. In one example, the heterogeneous, multiprocessor system is an OpenCL system. As shown, a host 1005 includes host memory 1010. Host 1005 may be implemented as processor 205, while host memory 1010 may be implemented as memory elements 210. Host 1005 is coupled to target platform 260 and to global memory and constant memory 1015. As discussed, access to global memory and constant memory 1015 may be provided by a memory controller (not shown). Global memory and constant memory 1015 may be implemented as RAM 345 with the memory controller being implemented within IC 270. It should be appreciated, however, that the memory controller may be implemented as a memory controller on target platform 260 that is external to IC 270, but which is configured to communicate with IC 270.

IC 270 includes compute units 1020 and 1025. While two compute units are pictured in IC 270, it should be appreciated that IC 270 may include fewer than two compute units or more than two compute units. Further, the particular compute units and the particular number of compute units implemented within IC 270 may change during runtime. Compute units 1020 and 1025 are implemented as part of kernel region 340. For purposes of illustration, static region 335 is not shown.

As pictured, compute unit 1020 includes a local memory 1030, processing elements 1040 and 1045, and private memories 1060 and 1065. Local memory 1030 is shared by processing elements 1040 and 1045. Each of processing units 1040 and 1045 is coupled to an individual, unshared one of private memories 1060 and 1065. Compute unit 1025 includes a local memory 1035, processing elements 1050 and 1055, and private memories 1070 and 1075. Local memory 1035 is shared by processing elements 1050 and 1055. Each of processing units 1050 and 1055 is coupled to an individual, unshared one of private memories 1070 and 1075. Compute units 1020 and 1025 both have access to global memory and constant memory 1020.

In one exemplary implementation, host memory 1010 and global memory and constant memory 1020 may be implemented using RAM on the target platform, host RAM, and/or one or more cache memories of the host. Local memories 1030 and 1035, for example, may be implemented within IC 270 using one or more BRAMs 103. Private memories 1060, 1065, 1070, and 1075 may be implemented using look-up table RAMs included within CLBs 102.

The allocation of memory structures of IC 270 to memories of memory architecture 1000 of FIG. 10 is provided for purposes of illustration only. It should be appreciated that, during synthesis, one or more other memory structures of IC 270 may be used to implement private memory and/or local memory depending upon availability of the memory structures of IC 270 and the amount of memory needed.

Figure 11:
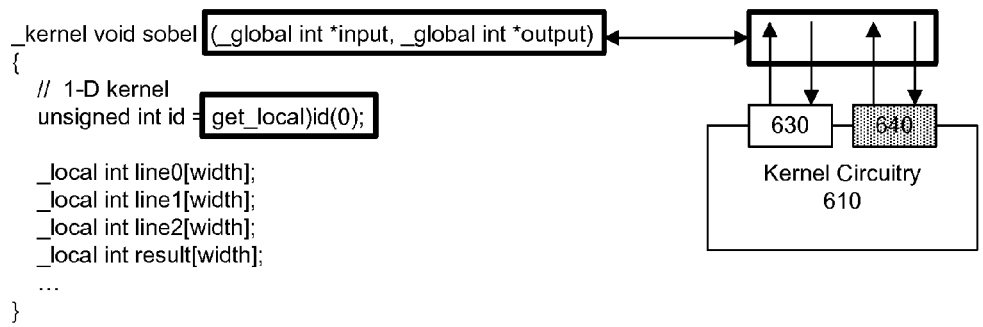
FIG. 11 is a block diagram illustrating exemplary processing of a kernel specified in a heterogeneous, multiprocessor computing language.

FIG. 11 is a block diagram illustrating exemplary processing of a kernel specified in a heterogeneous, multiprocessor computing language. While FIG. 11 illustrates an OpenCL example, it should be appreciated that kernels may be specified in a high level programming language other than OpenCL and that the inventive arrangements described within this disclosure are not intended to be limited to the examples provided. In one aspect, FIG. 11 illustrates processing performed in block 905 of FIG. 9. As pictured, the system identifies the "global int" instruction within the kernel. The "global int" instruction indicates the particular buffer that is passed from the host to the kernel. The system maps the memory accesses as transactions on the interconnects.

In another aspect, FIG. 11 illustrates processing performed in block 910 of FIG. 9. In the example of FIG. 11, the system determines that an identifier (id) is used as illustrated by the "get_local_id(0);" function. Pointers, for example, that are passed into the kernel from the host are specified within a register map implemented within the kernel. Data, such as the id, is written to the kernel by the host, e.g., by the host application executing in the host during runtime. For example, the host may write any necessary data such as the id to the appropriate register of the register map of the kernel circuitry 610.

The system further, from analysis of the program code of the kernel, identifies any implicit parameters used by the kernel. Examples of implicit parameters that may need to be provided to the kernel from the host include, but are not limited to, a size of an ND range, a size of a work group, or the like. In some cases, implicit parameters may not be passed through the interface between the host and the kernel. Such parameters, however, may be passed through the register map.

Figure 12:
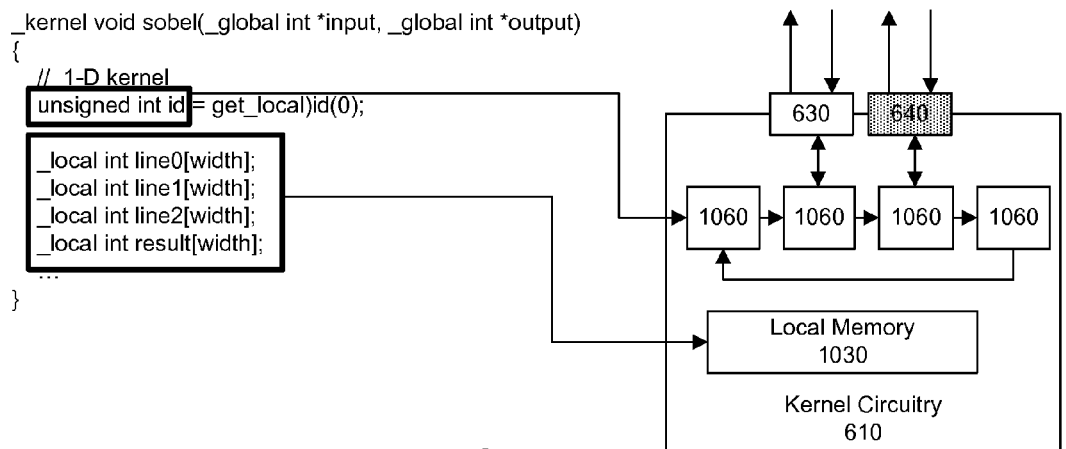
FIG. 12 is a block diagram illustrating exemplary processing of a kernel specified in a heterogeneous, multiprocessor computing language.

FIG. 12 is a block diagram illustrating exemplary processing of a kernel specified in a heterogeneous, multiprocessor computing language. While FIG. 12 illustrates an OpenCL example, it should be appreciated that kernels may be specified in a high level programming language other than OpenCL and that the inventive arrangements described within this disclosure are not intended to be limited to the examples provided. In one aspect, FIG. 12 illustrates processing performed in blocks 920 and 925 of FIG. 9. In the example of FIG. 12, referring to block 920, variables such as "id" are correlated to memory structures that implement private memory 1060 of the kernel. Examples of private memory may include pipeline registers, a small array, BRAMs, look-up table RAM, or the like. Referring to block 925, the system correlates each "local int" memory instruction with a local memory 1030 such as a BRAM within the kernel.

Figures 2, 13:
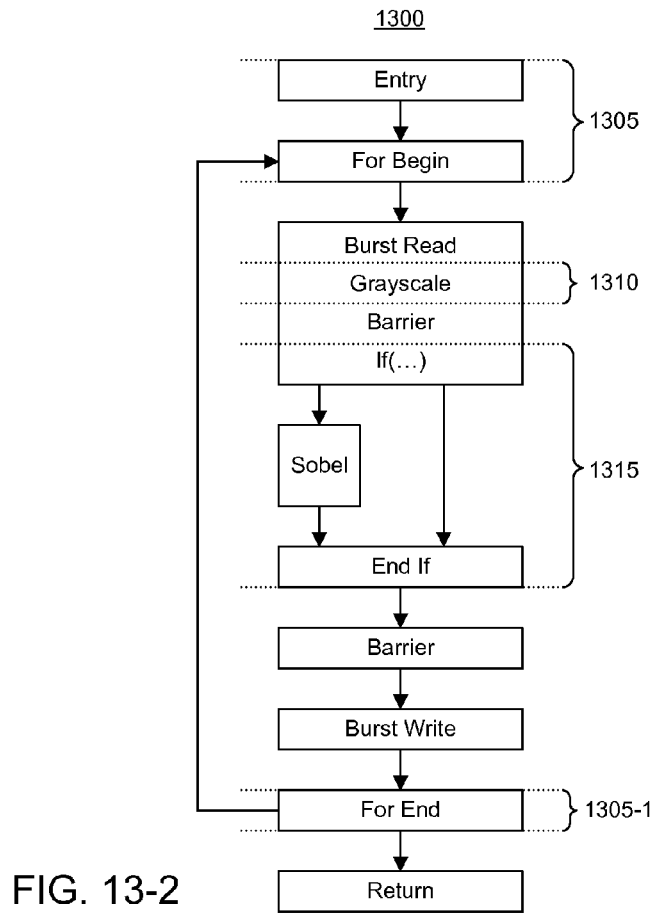

FIGS. 13-1 and 13-2, taken collectively and referred to collectively as FIG. 13, illustrate processing of a kernel specified in a heterogeneous, multiprocessor computing language. In one aspect, FIG. 13 illustrates processing performed in blocks 930 and 935 of FIG. 9. Referring to FIG. 13-1, exemplary OpenCL C source code for a kernel 1300 is pictured. While FIG. 13 illustrates an OpenCL example, it should be appreciated that kernels may be specified in a high level programming language other than OpenCL and that the inventive arrangements described within this disclosure are not intended to be limited to the examples provided.

The system identifies parallel regions of kernel 1300 as regions 1305, 1310, and 1315. As part of recognizing parallelism in block 930, the system may recognize specific instructions and/or constructs that control parallelism. The system may identify instances of the "barrier" instruction within kernel 1300. The "barrier" instruction for example, indicates that all work-items must reach the barrier instruction before any work items may proceed beyond the barrier instruction. The barrier instruction may be used as a memory fence or a synchronization mechanism. The system may identify instances of the "async_work_group_copy()" instruction (referred to as "async" herein). The "async" instruction specifies that all work-items must reach the copy with the same arguments. Thus, in one aspect, the system recognizes parallel regions of kernel 1300 by identifying instructions that control parallelism within kernel 1300.

The heterogeneous, multiprocessor execution and memory models guarantee that each of regions 1305, 1310, and 1315 may be implemented fully in parallel, fully sequentially, or in varying combination. The serialization that must be observed occurs with the instructions and/or constructs that directly influence parallelism, e.g., the barrier and/or async instructions.

FIG. 13-2 illustrates a data flow graph generation of block 925 for kernel 1300. Parallel regions 1305, 1310, and 1315 are indicated. A fourth parallel region 1305-1 is included corresponding to the end or return of the "for" portion included in region 1305.

Figure 14:
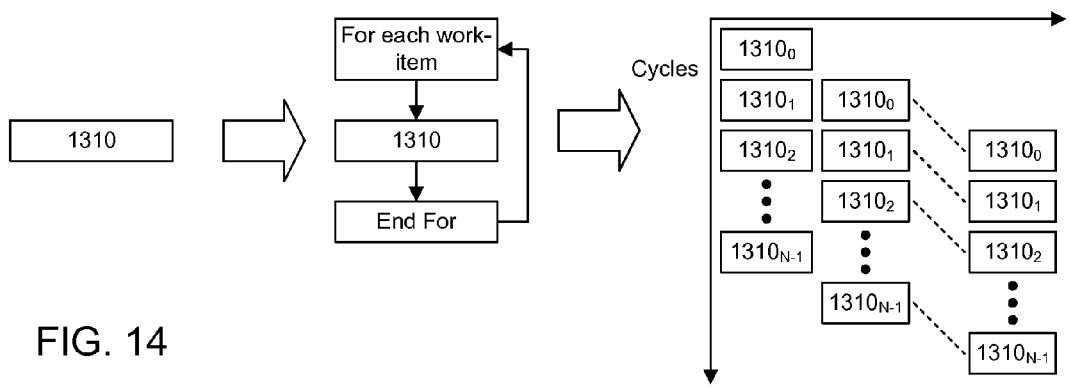
FIG. 14 is a block diagram illustrating exemplary processing of a kernel specified in a heterogeneous, multiprocessor computing language.

FIG. 14 is a block diagram illustrating exemplary processing of a kernel specified in a heterogeneous, multiprocessor computing language. In one example, the heterogeneous, multiprocessor computing language may be OpenCL. In one aspect, FIG. 14 illustrates processing performed in blocks 935 and 940 of FIG. 9. In the example of FIG. 14, processing of region 1310 corresponding to the grayscale conversion is illustrated. Each loop iteration processes one work-item. An entire loop processes one work-group. The loop may be implemented as a pipeline with a new work-item being introduced into the pipeline each clock cycle. As shown, the system creates a "for" loop construct around parallel region 1310. The circuit description is generated using pipelining as shown where each column of work-items corresponds to a pipeline stage of the kernel. Each row of work-items corresponds to a cycle.

The following illustrates an exemplary register map for a kernel.

// 0x00: Control signals
// bit 0—ap_start (Read/Write/COH)
// bit 1—ap_done (Read/COR)
// bit 2—ap_idle (Read)
// bit 3—ap_ready (Read)
// bit 7—auto_restart (Read/Write)
// others—reserved
// 0x04: Global Interrupt Enable Register
// bit 0—Global Interrupt Enable (Read/Write)
// others—reserved
// 0x08: IP Interrupt Enable Register (Read/Write)
// bit 0—Channel 0 (ap_done)
// bit 1—Channel 1 (ap_ready)
// others—reserved
// 0x0c: IP Interrupt Status Register (Read/TOW)
// bit 0—Channel 0 (ap_done)
// bit 1—Channel 1 (ap_ready)
// others—reserved
// 0x10: Data signal of group_id_x
// bit 31~0—group_id_x[31:0] (Read/Write)
// 0x14: reserved
// 0x18: Data signal of group_id_y
// bit 31~0—group_id_y[31:0] (Read/Write)
// 0x1c: reserved
// 0x20: Data signal of group_id_z
// bit 31~0—group_id_z[31:0] (Read/Write)
// 0x24: reserved
// 0x28: Data signal of global_offset_x
// bit 31~0—global_offset_x[31:0] (Read/Write)
// 0x2c: reserved
// 0x30: Data signal of global_offset_y
// bit 31~0—global_offset_y[31:0] (Read/Write)
// 0x34: reserved
// 0x38: Data signal of global_offset_z
// bit 31~0—global_offset_z[31:0] (Read/Write)
// 0x3c: reserved
// 0x40: Data signal of matrix
// bit 31~0—matrix[31:0] (Read/Write)
// 0x44: reserved
// 0x48: Data signal of maxIndex
// bit 31~0—maxIndex[31:0] (Read/Write)
// 0x4c: reserved
// 0x50: Data signal of s1
// bit 31~0—s1[31:0] (Read/Write)
// 0x54: reserved
// 0x58: Data signal of s2
// bit 31~0—s2[31:0] (Read/Write)
// 0x5c: reserved
// (SC=Self Clear, COR=Clear on Read, TOW=Toggle on Write, COH=Clear on Handshake)

Heterogeneous, multiprocessor HLS 890, as described with reference to FIG. 8, generates a custom register map as illustrated above for each kernel that is compiled into RTL. The host may use the register map to pass addresses of buffers, e.g., OpenCL buffers, in the device memory located on the target platform, scalar arguments to the kernel, and control signals to control the kernel. The register map may also be used by the host to pass a group id and a group offset to the kernel as required by the OpenCL specification. In one aspect, the register map may be included within the binary container that is generated. For example, the register map may be part of the supporting data that is incorporated into the binary container previously described.

The following illustrates an exemplary platform metadata file.

```
<platform name="vc690-admpcie7v31slot" ipiboard="" cfplatform="">
  <description>Alphadata ADM-PCIE-7V3 Partial Reconfiguration Single DIMM</description>
  <device name="cpu0" type="2">
    <core name="cpu0" type="cpu" numComputeUnits="1"/>
  </device>
  <device name="fpga0" type="8" fpgaDevice="virtex:xc7vx690t:ffg1157:-2">
    <core name="OCL_REGION_0" type="clc_region" clockFreq="100MHz"
```

```
    numComputeUnits="10">
      <port name="M_AXI_GMEM0" portType="addressable" mode="master"
      base="0x00000000" range="0x40000000" dataWidth="512"/>
      <port name="S_AXI_CONTROL0" portType="addressable"
      mode="slave" base="0x0" range="0x00010000" dataWidth="32"/>
    </core>
  </device>
</platform>
```

In one aspect, the platform metadata file illustrated above is an implementation of base platform description 825 described with reference to FIG. 8 and provided to system linker 830. As illustrated, the platform metadata file specifies the type of target platform, or board, to which the programmable IC is coupled. Further, the platform metadata file indicates the particular features of the programmable IC on the board, e.g., the model and/or type as well as clock frequencies of particular regions, e.g., the static region. Linker 830 may identify the target platform from the platform metadata file and access a directory structure named for the target platform specified in the platform metadata file.

Figure 15:
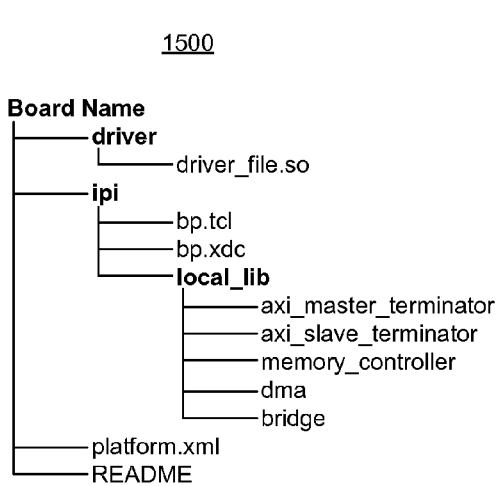
FIG. 15 is an exemplary directory structure.

FIG. 15 is an exemplary directory structure 1500. The top level directory indicated uses the same name as the target platform which may be read by system linker 830 from the platform metadata file. In this example, the top level directory is called "Board Name." Referring to the exemplary platform metadata file provided above, however, the top level directory may be specified as "VC690" or a derivative thereof. In any case, system linker 830 obtains platform FPGA 845 using the directory structure of FIG. 15. Directories are bolded in FIG. 15 for purposes of illustration. For example, "Board Name," "driver," "ipi," and "local_lib" are directories. The remaining items listed are files and/or packages.

The system may automatically locate any newly added target platform with the files being correctly packaged and added to a designated platform directory of the system. In the example shown, "driver_file.so" is the low level driver used by the host to communicate with the target platform over the bus. As illustrated, driver_file.so is located within the "driver" directory. The platform metadata file, referred to as "platform.xml" in the example of FIG. 15, is placed in the root directory. Any packaged IPs used in the static region of the IC as described with reference to FIGS. 3, 4, and 5 may be stored in the "local_lib" directory. A base platform block diagram TCL file called "bp.tcl" and any top level design constraint files, e.g., timing and/or physical constraints, on the static region circuit design are included in the "ipi" directory.

The common low level driver pictured as "driver_file.so" in FIG. 15 may include an API having a plurality of functions. The common low level driver API (hereafter "driver API") allows the heterogeneous, multiprocessor runtime program code executing in the host to communicate with the target platform. The driver API, for example, supports configuration bitstream download into the programmable IC, allocating and/or de-allocating buffers, migrating buffers from host memory to target platform memory, migrating target platform memory to host memory, and communicating with the kernel as implemented within the programmable IC through a control port of the kernel.

The driver API also supports address spaces. The address spaces may be used for accessing peripherals of the target platform. Each peripheral of the target platform, for example, may have its own memory mapped range of the address space. A target platform optionally may have a flat memory space that may be used to address all peripherals of the target platform.

The driver_file.so may support various quantities such as the minimum size of buffer, e.g., a DMA buffer, that may be read or written on the target platform. Further, one or more enumerated address spaces, referred to as "enums" may be supported. Memory operations may use flat addressing or relative addressing. Exemplary enums may include, but are not limited to, XCL_ADDR_SPACE_DEVICE_FLAT, XCL_ADDR_SPACE_DEVICE_RAM, XCL_ADDR_KERNEL_CTRL, and XCL_ADDR_SPACE_MAX.

The driver API supports multiple device access operations including, but not limited to:
  xclDeviceHandle xclOpen(const char *deviceName)
  void xclClose(xclDeviceHandle handle)
  int xclGetDeviceInfo(xclDeviceHandle handle, xclDeviceInfo *info) (xclDeviceHandle handle).

The driver API supports configuration bitstream load operations with the operation "int xclLoadBitstream(xclDeviceHandle handle, const char *fileName)". As such, the host may initiate loading of a configuration bitstream, whether full or partial, into the IC to implement one or more different kernels in hardware as needed during runtime.

The driver API provides various operations for managing memory of the target platform. The vendor of the target platform, for example, is required to provide memory management with the following APIs:
  uint64_t xclAllocDeviceBuffer(xclDeviceHandle handle, size_t size)

The operation "xclAllocDeviceBuffer" allocates a buffer of the specified size on the target platform and returns the offset of the allocated buffer in the target platform RAM as a return value. The offset acts as buffer handle. The OpenCL runtime will subsequently pass the returned handle to the OpenCL kernel. The OpenCL kernel will use the returned handle to perform bus master read and/or write operations on the allocated buffer in the target platform RAM. The host does not write to the target platform RAM directly. In the event that there are no free blocks remaining, the function should return −1.
  void xclFreeDeviceBuffer(xclDeviceHandle handle, uint64_t buf)

The operation "xclFreeDeviceBuffer" frees the memory previously allocated by xclAllocDeviceBuffer. The freed memory may be reused later for another call to xclAllocDeviceBuffer. An error condition results from passing a buffer handle not previously allocated by xclAllocDeviceBuffer.
  size_t xclCopyBufferHost2Device (xclDeviceHandle handle, uint64_t dest, const void *src, size_t size, size_t seek)

The operation "xclCopyBufferHost2Device" copies the contents of the host buffer into a destination buffer resident on the target platform. The element src refers to the host buffer pointer and dest refers to the device buffer handle. An error results in passing a dest handle not previously allocated by xclAllocDeviceBuffer. The element seek specifies the offset in the dest handle. An error results from passing size where size plus seek is greater than the size of the device buffer previously allocated. In the examples provided, a PCIe DMA is used to migrate the buffers.

size_t xclCopyBufferDevice2Host(xclDeviceHandle handle, void *dest, uint64_t src, size_t size, size_t skip)

The operation xclCopyBufferDevice2Host copies the contents from the target platform resident buffer to the host buffer. The element srs refers to the device buffer handle and the element dest refers to the host buffer pointer. An error results from passing a src handle not previously allocated by xclAllocDeviceBuffer. The element skip specifies the offset in src handle. An error results from passing size where size plus skip is greater than the size of device buffer previously allocated. In the examples provided, a PCIe DMA is used to migrate the buffer.

size_t xclWrite(xclDeviceHandle handle, xclAddressSpace space, uint64_t offset, const void *hostBuf, size_t size)

The operation xclWrite copies the contents of the host buffer hostBuf to a specific location in the target platform address map. The contents of hostBuf is used to program peripherals of the target platform. For example, the OpenCL runtime executing in the host uses this operation to send the arguments to the kernel within the programmable IC. The offsets are relative to the address space.

size_t xclRead(xclDeviceHandle handle, xclAddressSpace space, uint64_t offset, void *hostbuf, size_t size)

The operation xclRead copies data from a specific location in the target platform address map to the host buffer hostBuf. The operation is used to read the status of peripherals of the target platform. For example, the OpenCL runtime library uses this operation to determine whether the kernel is finished running. The offsets are relative to the address space.

The operating system of the host needs a kernel DMA driver to communicate with the target platform. In one aspect, the common low level driver API may be layered on top the kernel DMA driver to insulate the OpenCL runtime from the details of the driver. The driver should be multi-threading safe. The OpenCL runtime optionally uses more than one thread to read and write to the device at the same time.

In another aspect, the driver API may include interrupt functions. For example, the register map for the kernel may include one or more memory locations at which a flag may be stored by the kernel. Detection of the flag at the designated memory location of the register map may cause the static region to trigger an interrupt to the host through a function provided as part of the driver API.

While the examples illustrated above are directed to an OpenCL implementation, it should be appreciated that any heterogeneous, multiprocessor computing language may be used and that the various operations described as part of the API may be adapted accordingly.

Figure 16:
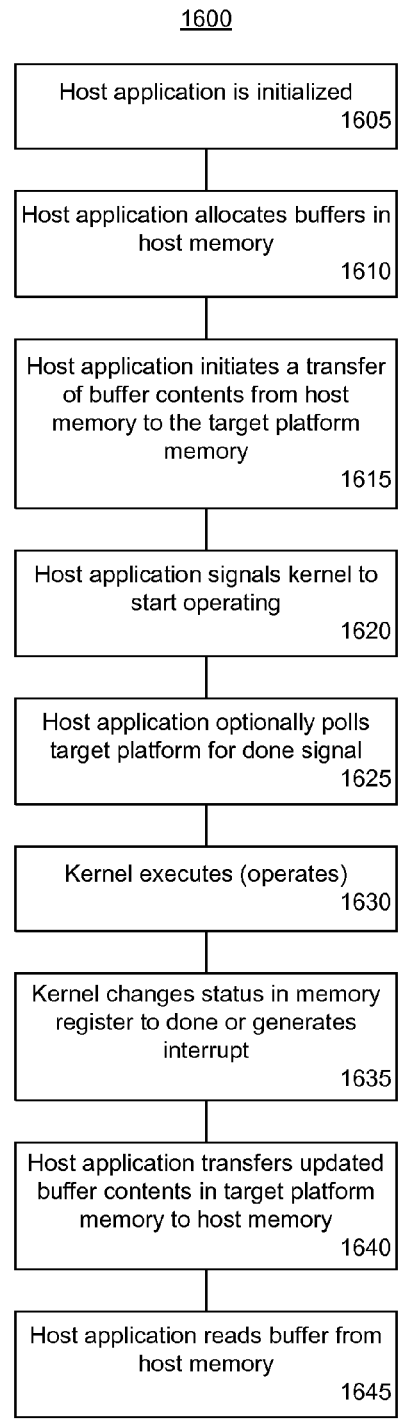
FIG. 16 is a flow chart illustrating an exemplary method of kernel execution.

FIG. 16 is a flow chart illustrating an exemplary method 1600 of kernel execution. Method 1600 begins in a state where the kernel is implemented within the programmable IC and the target platform is communicatively linked with the host. The host, for example, may include one or more binary containers or have access to one or more binary containers. The host accesses a binary container and provides the configuration bitstream file from the binary container to the IC, e.g., to RAM 345. The host may initiate the configuration bitstream load operation described as part of the driver API thereby causing the IC to load the configuration bitstream and implement a kernel specified by the configuration bitstream. As discussed, the host may cause one or more different configuration bitstreams, whether partial or full, to be loaded to implement one or more different kernels within the IC at various times during runtime.

In block 1605, the host application is initialized. The host application includes the heterogeneous, multiprocessor runtime library as illustrated in FIG. 8. In block 1610, the host application allocates buffers in host memory. In block 1615, the host application initiates a transfer to send the buffer contents from the host memory to the target platform memory.

In block 1620, the host application signals the kernel through the slave interface to start operating. In block 1625, the host application optionally starts polling the target platform to monitor for a done signal. In block 1630, the kernel, i.e., the hardware implementation of the kernel, executes, or begins to operate. The kernel loads and stores data from the target platform memory. In block 1635, the kernel changes the status in the memory map register to done responsive to finishing processing or generates an interrupt. In block 1640, the host application transfers the updated buffer contents of the target platform memory, i.e., the results, to the host memory. In block 1645, the heterogeneous, multiprocessor runtime, e.g., executing in the host or host application, reads the buffer from the host memory.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined within this disclosure, the terms "a" and "an" mean one or more than one. The term "plurality," as defined herein, means two or more than two. The term "another," as defined herein, means at least a second or more. The term "coupled," as defined herein, means connected, whether directly without any intervening elements or indirectly with one or more intervening elements, unless otherwise indicated. Two elements may also be coupled mechanically, electrically, or communicatively linked through a communication channel, pathway, network, or system.

As defined herein, the term "automatically" means without user intervention. As defined herein, the term "user" means a human being. The term "and/or" as defined herein means any and all possible combinations of one or more of the associated listed items. The terms "includes" and/or "including," when used in this disclosure, specify the presence of stated features, integers, steps, operations, elements, and/or components, but do not preclude the presence or addition of one or more other features, integers, steps, operations, elements, components, and/or groups thereof. Although the terms "first," "second," etc. may be used herein to describe various elements, these elements should not be limited by these terms, as these terms are only used to distinguish one element from another unless the context indicates otherwise.

As defined herein, the term "if" means "when," "upon," "in response to determining," "in response to detecting," "responsive to determining," or "responsive to detecting," depending on the context. Similarly, the phrase "if it is determined" or the phrase "if [a stated condition or event] is detected," as defined herein, means "upon determining," "in response to determining," "responsive to determining," "upon detecting [the stated condition or event]," "in response to detecting [the stated condition or event]," or "responsive to detecting [the stated condition or event]," depending on the context.

Within this disclosure, the same reference characters are used to refer to terminals, signal lines, wires, and their corresponding signals. In this regard, the terms "signal," "wire," "connection," "terminal," and "pin" may be used interchangeably, from time-to-time, within this disclosure. It also should be appreciated that the terms "signal," "wire," or the like may represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

One or more aspects described within this disclosure may be realized in hardware or a combination of hardware and software. One or more aspects may be realized in a centralized fashion in one system or in a distributed fashion where different elements are spread across several interconnected systems. Any kind of data processing system or other apparatus adapted for carrying out at least a portion of the methods described herein is suited.

One or more aspects further may be embedded in a computer program product, which includes all the features enabling the implementation of the methods described herein. The computer program product includes a computer-readable data storage medium. As defined herein, the phrase "computer-readable storage medium" means a storage medium that contains or stores program code for use by or in connection with an instruction execution system, apparatus, or device. As defined herein, a "computer-readable storage medium" is non-transitory and, as such, is not a transitory propagating signal per se. Examples of a computer-readable storage medium may include, but are not limited to, optical media, magnetic media, magneto-optical media, computer memory such as RAM, a bulk storage device, e.g., hard disk, or the like.

The flowchart and block diagrams in the Figures illustrate the architecture, functionality, and operation of possible implementations of systems, methods and computer program products according to various aspects of the inventive arrangements disclosed herein. In this regard, each block in the flowchart or block diagrams may represent a module, segment, or portion of code, which includes one or more executable instructions for implementing the specified function(s). It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In one aspect, the blocks in the flow chart illustration may be performed in increasing numeric order corresponding to the numerals in the various blocks. In other aspects, the blocks may be performed in an order that is different, or that varies, from the numerals in the blocks. For example, two or more blocks shown in succession may be executed substantially concurrently. In other cases, two or more blocks may sometimes be executed in the reverse order, depending upon the functionality involved. In still other cases, one or more blocks may be performed in varying order with the results being stored and utilized in subsequent or other blocks that do not immediately follow.

The terms "computer program," "software," "application," "computer-usable program code," "program code," "executable code," variants and/or combinations thereof, in the present context, mean any expression, in any language, code or notation, of a set of instructions intended to cause a data processing system to perform a particular function either directly or after either or both of the following: a) conversion to another language, code, or notation; b) reproduction in a different material form. For example, program code may include, but is not limited to, a subroutine, a function, a procedure, an object method, an object implementation, an executable application, an applet, a servlet, source code, object code, a shared library/dynamic load library and/or other sequence of instructions designed for execution on a computer system.

Thus, throughout this disclosure, statements utilizing terms such as "processing" or "computing" or "calculating" or "determining" or "displaying" or the like, refer to the action and processes of a data processing system, e.g., a computer system, or similar electronic computing device, that manipulates and transforms data represented as physical (electronic) quantities within the computer system's registers and/or memories into other data similarly represented as physical quantities within the computer system memories and/or registers or other such information storage, transmission or display devices.

The corresponding structures, materials, acts, and equivalents of all means or step plus function elements in the claims below are intended to include any structure, material, or act for performing the function in combination with other claimed elements as specifically claimed.

A method includes generating, using a processor, an RTL description of a first kernel of a heterogeneous, multiprocessor design, integrating the RTL description of the first kernel with a base platform circuit design providing a static region within a programmable IC that provides an interface to a host of the heterogeneous, multiprocessor design, and generating, from the RTL description of the first kernel and using the processor, a first configuration bitstream specifying a hardware implementation of the first kernel and supporting data for the configuration bitstream. The method also includes including the first configuration bitstream and the supporting data within a binary container.

In one example, the heterogeneous, multiprocessor design is an OpenCL design and the first kernel is specified in OpenCL.

In one aspect, the supporting data includes a two-dimensional location of the hardware implementation of the first kernel as implemented within the programmable IC.

The method may include loading the configuration bitstream of the first kernel creating an instance of the hardware implementation of the first kernel within the programmable IC during runtime of the heterogeneous, multiprocessor design.

The method may also include loading the configuration bitstream of the first kernel creating a plurality of instances of the hardware implementation of the first kernel within the programmable IC during runtime of the heterogeneous, multiprocessor design.

The method further may include including a second configuration bitstream specifying a hardware implementation of a second kernel of the heterogeneous, multiprocessor design within a second binary container. At least one instance of the hardware implementation of the second kernel may be created within the programmable IC.

In one aspect, generating the first configuration bitstream may include generating the first configuration bitstream as a partial configuration bitstream specifying kernel circuitry. In another aspect, generating the first configuration bitstream may include generating the first configuration bitstream as a full configuration bitstream specifying the kernel circuitry and base platform circuitry.

A method includes generating, using a processor, an RTL description of a first kernel of a heterogeneous, multiprocessor design, integrating the RTL description of the first kernel with a base platform circuit design providing a static interface within a programmable IC to a host of the heterogeneous, multiprocessor design, and generating, from the RTL description of the first kernel and using the processor, supporting data for the RTL description of the first kernel. The method also includes including the RTL description of the first kernel and the supporting data within a binary container.

In one example, the heterogeneous, multiprocessor design is an OpenCL design and the first kernel is specified in OpenCL.

The method may include generating an executable version of the kernel and including the executable version of the kernel within the binary container.

The method may also include a host providing the RTL description from the binary container, during runtime, to an RTL simulator and simulating the RTL description of the kernel in the RTL simulator.

The method further may include including an RTL description of a second kernel of the heterogeneous, multiprocessor design within a second binary container.

A system may include a processor programmed to initiate executable operations. The executable operations include generating an RTL description of a first kernel of a heterogeneous, multiprocessor design, integrating the RTL description of the first kernel with a base platform circuit design providing a static region within a programmable IC that provides an interface to a host of the heterogeneous, multiprocessor design, and generating, from the RTL description of the first kernel, a first configuration bitstream specifying a hardware implementation of the first kernel and supporting data for the configuration bitstream. The method may also include including the first configuration bitstream and the supporting data within a binary container.

In one example, the heterogeneous, multiprocessor design is an OpenCL design and the first kernel is specified in OpenCL.

The supporting data may include a two-dimensional location of the hardware implementation of the first kernel as implemented within the programmable IC.

The executable operations may include loading the configuration bitstream of the first kernel creating an instance of the hardware implementation of the first kernel within the programmable IC during runtime of the heterogeneous, multiprocessor design.

The executable operations may also include loading the configuration bitstream of the first kernel creating a plurality of instances of the hardware implementation of the first kernel within the programmable IC during runtime of the heterogeneous, multiprocessor design.

The executable operations further may include including a second configuration bitstream specifying a hardware implementation of a second kernel of the heterogeneous, multiprocessor design within a second binary container. The executable operations may include creating at least one instance of the hardware implementation of the second kernel within the programmable IC.

In one aspect, generating the first configuration bitstream may include generating the first configuration bitstream as a partial configuration bitstream specifying kernel circuitry. In another aspect, generating the first configuration bitstream may include generating the first configuration bitstream as a full configuration bitstream specifying the kernel circuitry and base platform circuitry.

The features described within this disclosure may be embodied in other forms without departing from the spirit or essential attributes thereof. Accordingly, reference should be made to the following claims, rather than to the foregoing disclosure, as indicating the scope of such features and implementations.

What is claimed is:

1. A method, comprising:
    generating, using a processor, a register transfer level description of a first kernel of a heterogeneous, multiprocessor design;
    integrating the register transfer level description of the first kernel with a base platform circuit design providing a static region within a programmable integrated circuit that provides an interface to a host of the heterogeneous, multiprocessor design;
    generating, from the register transfer level description of the first kernel and using the processor, a first configuration bitstream specifying a hardware implementation of the first kernel and supporting data for the configuration bitstream; and
    including the first configuration bitstream and the supporting data within a binary container.

2. The method of claim 1, wherein the supporting data comprises a two-dimensional location of the hardware implementation of the first kernel as implemented within the programmable integrated circuit.

3. The method of claim 1, further comprising:
    loading the configuration bitstream of the first kernel creating an instance of the hardware implementation of the first kernel within the programmable integrated circuit during runtime of the heterogeneous, multiprocessor design.

4. The method of claim 1, wherein the supporting data comprises a list of cores included in the hardware implementation of the kernel.

5. The method of claim 1, further comprising:
    including a second configuration bitstream specifying a hardware implementation of a second kernel of the heterogeneous, multiprocessor design within a second binary container.

6. The method of claim 1, wherein integrating the register transfer level description of the first kernel with a base platform circuit design comprises:
    determining interconnect circuit blocks of the base platform circuit design;
    wherein the first configuration bitstream is generated to integrate the interconnect circuit blocks of the base platform circuit design with the hardware implementation of the kernel.

7. The method of claim 1, wherein generating the first configuration bitstream comprises:
    generating the first configuration bitstream as a partial configuration bitstream specifying kernel circuitry.

8. The method of claim 1, wherein generating the first configuration bitstream comprises:
    generating the first configuration bitstream as a full configuration bitstream specifying the kernel circuitry and base platform circuitry.

9. A method, comprising:
    generating, using a processor, a register transfer level description of a first kernel of a heterogeneous, multiprocessor design;
    integrating the register transfer level description of the first kernel with a base platform circuit design providing a static region within a programmable integrated circuit that provides an interface to a host of the heterogeneous, multiprocessor design;

generating, from the register transfer level description of the first kernel and using the processor, supporting data register for the transfer level description of the first kernel; and including the register transfer level description of the first kernel and the supporting data within a binary container.

10. The method of claim 9, further comprising:

generating an executable version of the kernel; and including the executable version of the kernel within the binary container.

11. The method of claim 9, further comprising:

a host providing the register transfer level description from the binary container, during runtime, to a register transfer level simulator; and simulating the register transfer level description of the kernel in the register transfer level simulator.

12. The method of claim 9, further comprising:

including a register transfer level description of a second kernel of the heterogeneous, multiprocessor design within a second binary container.

13. A system, comprising:

a processor programmed to initiate executable operations comprising:

generating a register transfer level description of a first kernel of a heterogeneous, multiprocessor design;

integrating the register transfer level description of the first kernel with a base platform circuit design providing a static region within a programmable integrated circuit that provides an interface to a host of the heterogeneous, multiprocessor design;

generating, from the register transfer level description of the first kernel, a first configuration bitstream specifying a hardware implementation of the first kernel and supporting data for the configuration bitstream; and including the first configuration bitstream and the supporting data within a binary container.

14. The system of claim 13, wherein the supporting data comprises a two-dimensional location of the hardware implementation of the first kernel as implemented within the programmable integrated circuit.

15. The system of claim 13, wherein the executable operations further include:

loading the configuration bitstream of the first kernel creating an instance of the hardware implementation of the first kernel within the programmable integrated circuit during runtime of the heterogeneous, multiprocessor design.

16. The system of claim 13, wherein the supporting data comprises a list of cores included in the hardware implementation of the kernel.

17. The system of claim 13, wherein the executable operations further include:

including a second configuration bitstream specifying a hardware implementation of a second kernel of the heterogeneous, multiprocessor design within a second binary container.

18. The system of claim 13, wherein integrating the register transfer level description of the first kernel with a base platform circuit design comprises:

determining interconnect circuit blocks of the base platform circuit design;

wherein the first configuration bitstream is generated to integrate the interconnect circuit blocks of the base platform circuit design with the hardware implementation of the kernel.

19. The system of claim 13, wherein generating the first configuration bitstream comprises:

generating the first configuration bitstream as a partial configuration bitstream specifying kernel circuitry.

20. The system of claim 13, wherein generating the first configuration bitstream comprises:

generating the first configuration bitstream as a full configuration bitstream specifying the kernel circuitry and base platform circuitry.

* * * * *